US012565043B2

(12) United States Patent
Hirabayashi et al.

(10) Patent No.: US 12,565,043 B2
(45) Date of Patent: Mar. 3, 2026

(54) PIEZOELECTRIC ACTUATOR, LIQUID DISCHARGE HEAD, AND LIQUID DISCHARGE APPARATUS

(71) Applicants: Takuma Hirabayashi, Tokyo (JP); Kaname Morita, Kanagawa (JP)

(72) Inventors: Takuma Hirabayashi, Tokyo (JP); Kaname Morita, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 112 days.

(21) Appl. No.: 18/611,721

(22) Filed: Mar. 21, 2024

(65) Prior Publication Data

US 2024/0316931 A1 Sep. 26, 2024

(30) Foreign Application Priority Data

Mar. 24, 2023 (JP) ................................. 2023-047673

(51) Int. Cl.
*B41J 2/14* (2006.01)
*H10N 30/20* (2023.01)
*H10N 30/87* (2023.01)

(52) U.S. Cl.
CPC ...... *B41J 2/14233* (2013.01); *H10N 30/2047* (2023.02); *H10N 30/87* (2023.02)

(58) Field of Classification Search
CPC ................... B41J 2/14233; B41J 2/161; B41J 2002/14241; B41J 2002/14419; B41J 2/1628; B41J 2/1629; B41J 2/1631; B41J 2/1646; B41J 2002/14491; H10N 30/2047; H10N 30/87
See application file for complete search history.

(56) References Cited

U.S. PATENT DOCUMENTS 8,752,938 B2 * 6/2014 Miyazawa ........... B41J 2/14233
347/68
2013/0176364 A1 7/2013 Machida et al.
(Continued)

FOREIGN PATENT DOCUMENTS

CN 113352755 A * 9/2021 ................ B41J 2/14
EP 3885139 A1 9/2021
(Continued)

OTHER PUBLICATIONS

Koike, Harunobu et al., "Liquid" (CN 113352755 A), Sep. 7, 2021, [Abstract] (Year: 2021).*

*Primary Examiner* — Lisa Solomon
(74) *Attorney, Agent, or Firm* — XSENSUS LLP

(57) ABSTRACT

A piezoelectric actuator includes: a substrate having an opening; a diaphragm having one face on the substrate in a first direction, the diaphragm facing the opening; a lower electrode on another face of the diaphragm opposite to the one face of the diaphragm in the first direction; a piezoelectric body on the lower electrode in the first direction; and an upper electrode on the piezoelectric body in the first direction, wherein the lower electrode has a thick portion on a part of the lower electrode, the thick portion has a thickness larger than a portion other than the part of the lower electrode in the first direction, and the upper electrode has a raised portion on a part of the upper electrode covering at least a portion of the thick portion of the lower electrode in a second direction orthogonal to the first direction.

15 Claims, 14 Drawing Sheets

COMPARATIVE EXAMPLE

(56)     References Cited

U.S. PATENT DOCUMENTS

| 2014/0375725 | A1 | 12/2014 | Sameshima et al. |
| 2017/0306471 | A1 | 10/2017 | Abe et al. |
| 2018/0117915 | A1 | 5/2018 | Takeuchi et al. |
| 2019/0193403 | A1 | 6/2019 | Niisato et al. |
| 2019/0283423 | A1 | 9/2019 | Tsuzuki et al. |
| 2020/0031113 | A1 | 1/2020 | Kondo et al. |
| 2020/0269575 | A1 | 8/2020 | Kobayashi et al. |
| 2022/0242123 | A1 | 8/2022 | Hirabayashi et al. |
| 2023/0021821 | A1 | 1/2023 | Kuroda et al. |
| 2023/0108462 | A1 | 4/2023 | Masuda et al. |
| 2023/0135522 | A1 | 5/2023 | Watanabe et al. |
| 2023/0157177 | A1 | 5/2023 | Hirabayashi et al. |
| 2023/0278337 | A1 | 9/2023 | Hirabayashi et al. |
| 2023/0294403 | A1 | 9/2023 | Nagahashi et al. |
| 2023/0398779 | A1 | 12/2023 | Masuda et al. |
| 2024/0066865 | A1 | 2/2024 | Ueda et al. |

FOREIGN PATENT DOCUMENTS

| JP | 2010-228276 | A | 10/2010 |
| JP | 2013-143456 | A | 7/2013 |
| JP | 2015-110338 | A | 6/2015 |

* cited by examiner

FIG. 2A  COMPARATIVE EXAMPLE
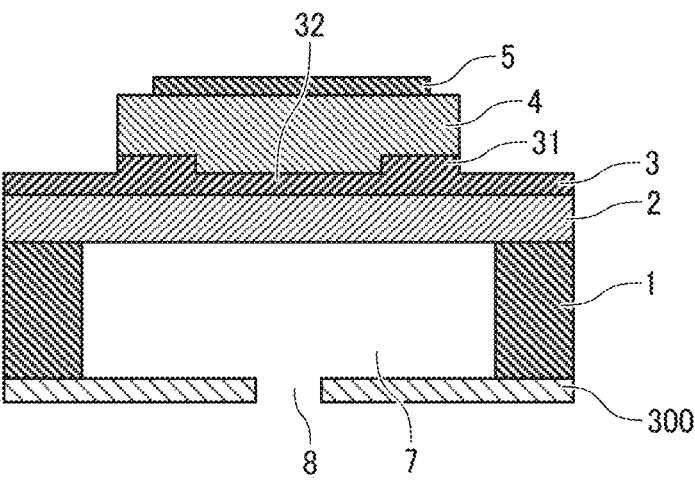
FIG. 2B  COMPARATIVE EXAMPLE
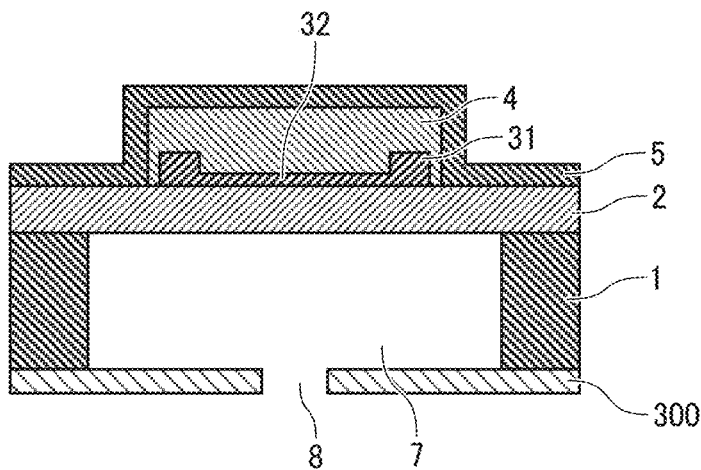
FIG. 2C  COMPARATIVE EXAMPLE
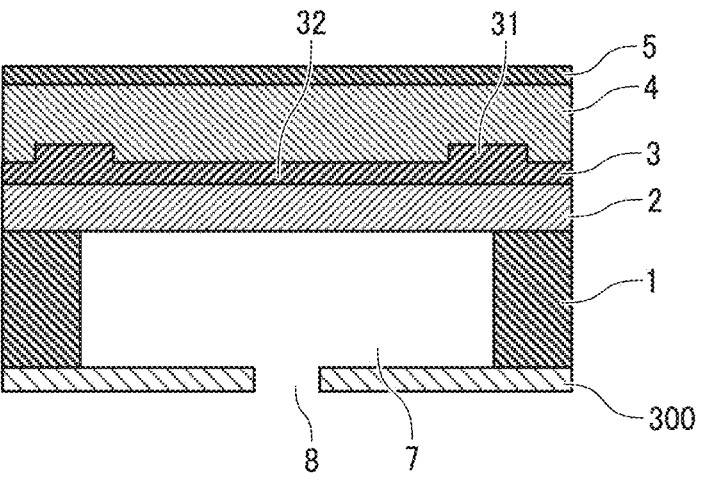

PIEZOELECTRIC ACTUATOR, LIQUID DISCHARGE HEAD, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application No. 2023-047673, filed on Mar. 24, 2023, in the Japan Patent Office, the entire disclosure of which is hereby incorporated by reference herein.

BACKGROUND

Technical Field

The present disclosure relates to a piezoelectric actuator, a liquid discharge head, and a liquid discharge apparatus.

Related Art

A liquid discharge head discharges liquid in a pressure chamber from a nozzle by using a piezoelectric actuator including a piezoelectric element. The piezoelectric element includes, for example, a lower electrode, a piezoelectric body, and an upper electrode that have been layered.

The piezoelectric actuator includes a diaphragm and the piezoelectric element that are formed on a substrate having an opening. When a voltage is applied between the upper electrode and the lower electrode, the piezoelectric body is electrically driven to displace the diaphragm. The piezoelectric body is also referred to as a piezoelectric or the like. Application of a voltage between the upper electrode and the lower electrode causes crystals in the piezoelectric body to be distorted. As a result, the piezoelectric body is deformed. While the piezoelectric body is being driven, stress is generated on the piezoelectric body, the diaphragm, or the like. Thus, damage is likely to be caused at a portion where stress is concentrated.

Examples of the portion where stress is concentrated on the piezoelectric body (also referred to as a piezoelectric layer or the like) include a boundary between a portion (also referred to as an active portion or the like) that is displaced by application of a voltage and a portion (also referred to as an inactive portion or the like) where no voltage is applied. In addition, the portion where stress is concentrated on the piezoelectric body includes a boundary between a portion where a liquid chamber (opening) has been opened and a portion where no liquid chamber (opening) has been opened.

SUMMARY

In an aspect of the present disclosure, a piezoelectric actuator includes: a substrate having an opening; a diaphragm having one face on the substrate in a first direction, the diaphragm facing the opening; a lower electrode on another face of the diaphragm opposite to the one face of the diaphragm in the first direction; a piezoelectric body on the lower electrode in the first direction; and an upper electrode on the piezoelectric body in the first direction, wherein the lower electrode has a thick portion on a part of the lower electrode, the thick portion has a thickness larger than a portion other than the part of the lower electrode in the first direction, the upper electrode has a raised portion on a part of the upper electrode covering at least a portion of the thick portion of the lower electrode in a second direction orthogonal to the first direction, and the raised portion is raised above a rest of the upper electrode in the first direction.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein:

FIGS. 2A to 2C are cross-sectional schematic diagrams for describing piezoelectric actuators according to first to third comparative examples;

FIG. 14A-2 is a plan schematic diagram for describing the ninth example;

FIG. 14B-1 is a cross-sectional schematic diagram for describing a tenth example;

FIG. 14B-2 is a plan schematic diagram for describing the tenth example;

Figure 1A:
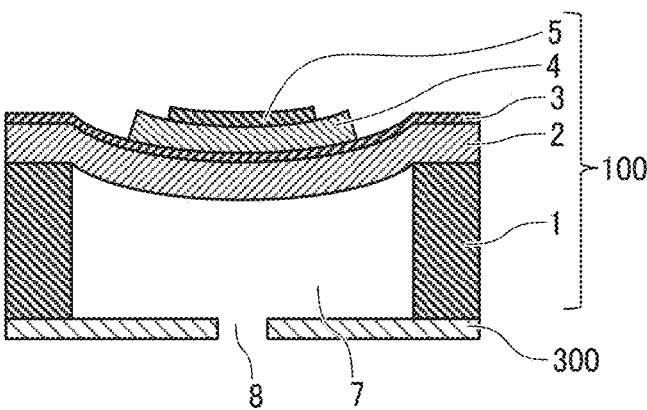
FIGS. 1A to 1C are cross-sectional schematic diagrams for describing examples of a piezoelectric actuator according to the present disclosure.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity.

However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

Hereinafter, a piezoelectric actuator, a liquid discharge head, and a liquid discharge apparatus according to the present disclosure will be described with reference to the drawings. Note that the following embodiments are not limiting the present disclosure, and any deletion, addition, modification, change, etc. can be made within a scope in which a person skilled in the art can conceive including other embodiments, and any of which is included within the scope of the present disclosure as long as the effect and feature of the present disclosure are demonstrated.

A piezoelectric actuator according to the present disclosure includes: a substrate having an opening; a diaphragm on one face of the substrate, the diaphragm being formed in a region including the opening; a lower electrode on a face of the diaphragm opposite to the substrate, the lower electrode being formed in at least a part of a region on an inner side of the opening as viewed from a first direction, the first direction being defined as a direction orthogonal to the one face; a piezoelectric body on the lower electrode; and an upper electrode on the piezoelectric body, wherein in a case where an active region is defined as a region where the opening, the diaphragm, the lower electrode, the piezoelectric body, and the upper electrode all overlap as viewed from the first direction, the lower electrode has a first region and a second region, the first region being in the active region, the lower electrode having a thickness of a first thickness t1 in the first region, the second region being provided in such a way as to be at least partially included in the active region as viewed from the first direction, the lower electrode having a thickness of a second thickness t2 in the second region, the second thickness t2 being larger than the first thickness t1, and in a case where a distance t3 is defined as a distance in the first direction from the diaphragm to the upper electrode in the second region, the first region includes a region where a distance in the first direction from the diaphragm to the upper electrode is a distance t4 smaller than the distance t3.

A liquid discharge head according to the present disclosure includes: the piezoelectric actuator according to the present disclosure; and a nozzle forming member joined to the substrate, the nozzle forming member and the diaphragm being located on opposite sides of the substrate, a nozzle corresponding to the opening being formed in the nozzle forming member, wherein liquid stored in the opening is discharged from the nozzle.

A liquid discharge apparatus according to the present disclosure includes: the liquid discharge head according to the present disclosure; and a driver that drives the piezoelectric actuator. The driver that drives the piezoelectric actuator refers to, for example, a driver that drives a piezoelectric element included in the piezoelectric actuator.

The piezoelectric actuator of the present disclosure can be applied to, for example, a liquid discharge head, and a liquid discharge apparatus including a liquid discharge head. The effect of the present disclosure is not limited to the liquid discharge head, and the effect is also exhibited even when the piezoelectric actuator of the present disclosure is used for, for example, an ultrasonic oscillator and an optical element (for example, a microelectromechanical system (MEMS) mirror). In addition to the actuator of a liquid discharge head, the piezoelectric actuator of the present disclosure can also be used for, for example, an oscillation device of an ultrasonic diagnostic apparatus and a MEMS mirror actuator.

[Basic Configuration of Piezoelectric Actuator]

A piezoelectric actuator according to the present embodiment includes: a substrate having an opening; a diaphragm on one face of the substrate, the diaphragm being formed in a region including the opening; a lower electrode on a face of the diaphragm opposite to the substrate, the lower electrode being formed in at least a part of a region on an inner side of the opening as viewed from a first direction, the first direction being defined as a direction orthogonal to the one face; a piezoelectric body on the lower electrode; and an upper electrode on the piezoelectric body. The first direction may be referred to as a layered direction or the like. The layered direction refers to, for example, a layered direction of the substrate and a layered direction of the diaphragm.

Figure 1B:
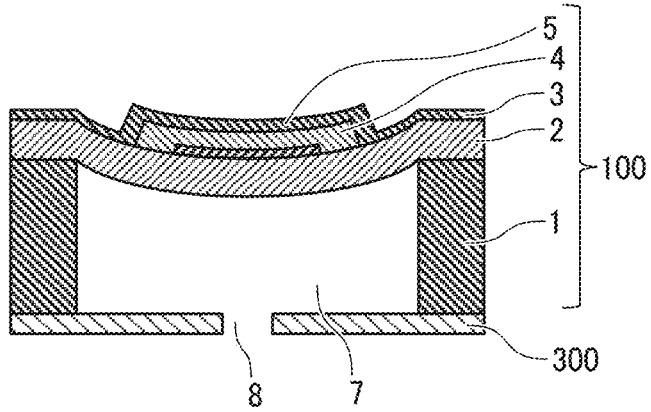
Figure 1C:
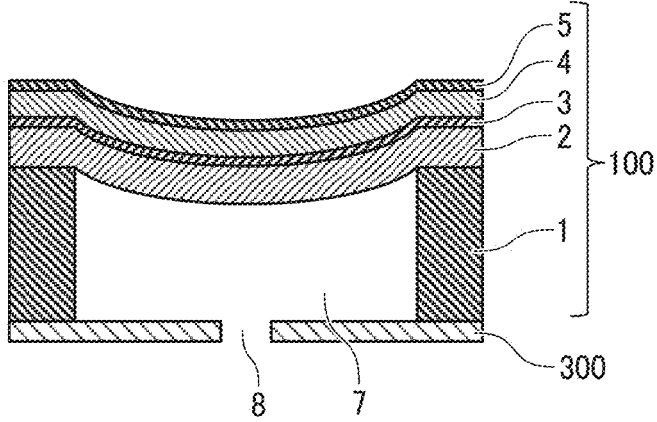

FIGS. 1A to 1C are cross-sectional schematic diagrams for schematically describing a basic configuration of the piezoelectric actuator according to the present embodiment. Examples illustrated in FIGS. 1A to 1C are configurations that also apply to general piezoelectric actuators.

FIGS. 1A to 1C are diagrams schematically illustrating examples in which a part of the piezoelectric actuator is bent, and are cross-sectional views of a liquid chamber taken along a short side direction. FIGS. 1A to 1C illustrate examples in which the piezoelectric actuator of the present embodiment has been applied to a liquid discharge head. Meanwhile, as described above, the piezoelectric actuator of the present disclosure is not limited to application to a liquid discharge head.

A piezoelectric actuator 100 of the present example includes a substrate having an opening. The substrate refers to, for example, a liquid chamber substrate 1 in the drawing. The liquid chamber substrate 1 may be simply referred to as a substrate, or may be referred to as a channel substrate, a channel forming substrate, a liquid chamber forming substrate, or the like. The opening refers to, for example, a liquid chamber 7 in the drawing. The liquid chamber 7 may be simply referred to as an opening, or may be referred to as an individual liquid chamber, a pressurized liquid chamber, a pressure chamber, or the like. Furthermore, the piezoelectric actuator 100 of the present example may be referred to as an actuator substrate or the like.

In the present embodiment, an example in which the piezoelectric actuator is used for a liquid discharge head will be mainly described. Therefore, an example in which the above-described opening corresponds to the liquid chamber 7 is used in the following description. When the opening corresponds to the liquid chamber 7, liquid (for example, ink) is supplied to the liquid chamber 7. The present disclosure is not limited thereto. The opening need not be the liquid chamber 7, and liquid need not be supplied to the opening in such a case.

The liquid chamber 7 (opening) may have, for example, a shape having a short side and a long side in a plane viewed from the first direction.

The liquid chamber substrate 1 is joined to a nozzle plate 300 having a nozzle 8 (also referred to as a nozzle hole or the like). The nozzle 8 communicates with the liquid chamber 7, and droplets are discharged from the nozzle 8.

The piezoelectric actuator 100 of the present example includes a diaphragm 2. The diaphragm 2 is formed on one face of the liquid chamber substrate 1. The diaphragm 2 is formed in a region including the liquid chamber 7 (opening).

The piezoelectric actuator 100 of the present example includes a lower electrode 3, a piezoelectric body 4, and an upper electrode 5. The lower electrode 3 is on a face of the diaphragm 2 opposite to the liquid chamber substrate 1. The piezoelectric body 4 is formed on the lower electrode 3. The upper electrode 5 is formed on the piezoelectric body 4. In addition, the lower electrode 3 is formed in at least a part of a region on an inner side of the liquid chamber 7 in the plane viewed from the first direction. A detailed example of the lower electrode 3 will be described below.

The piezoelectric body 4 can be made of, for example, lead zirconate titanate (PZT), and may be referred to as a piezoelectric or the like. A portion including the lower electrode 3, the piezoelectric body 4, and the upper electrode 5 may be referred to as a piezoelectric element, a piezoelectric body element, or the like. In the case of a liquid discharge head, when the piezoelectric element is driven, the diaphragm 2 and the like are bent, as illustrated in FIGS. 1A to 1C, to apply pressure to the liquid chamber 7. As a result, liquid in the liquid chamber 7 is discharged from the nozzle 8.

In the present embodiment, a region where the liquid chamber 7 (opening), the diaphragm 2, the lower electrode 3, the piezoelectric body 4, and the upper electrode 5 all overlap as viewed from the first direction is also referred to as an active region. For example, the location of the active region can also be grasped from cross-sectional views as illustrated in FIGS. 1A to 1C. The first direction may be referred to as a layered direction of the diaphragm 2, a layered direction of the substrate, or the like, or may be simply referred to as a layered direction or the like.

In addition, a region located in the liquid chamber 7 (opening) and not sandwiched between the lower electrode 3 and the upper electrode 5, as viewed from the first direction, may be referred to as an inactive region or the like. From this viewpoint, it can also be said that the active region corresponds to a region where the piezoelectric body 4 is sandwiched between the lower electrode 3 and the upper electrode 5.

The example illustrated in FIG. 1A is an example in which the lower electrode 3 has been patterned as a common electrode, and the example illustrated in FIG. 1B is an example in which the upper electrode 5 has been patterned as a common electrode. In these examples, there are active regions and inactive regions. When a voltage is applied, the active region is displaced by itself. Meanwhile, the inactive region is not displaced. Therefore, a rapid change in force occurs at a boundary between the active region and the inactive region, leading to stress concentration.

FIG. 1C illustrates an example of a case where the electrodes are disposed in such a way as to completely cover a liquid chamber 13. In this example, the lower electrode 3 may be a common electrode. Alternatively, the upper electrode 5 may be a common electrode. In this example, the entire region of the piezoelectric element in the liquid chamber 13 corresponds to the active region. Meanwhile, in a region outside the liquid chamber 13, the piezoelectric element is supported by the liquid chamber substrate 1. Thus, deformation of the diaphragm 2 and the like is prevented.

Therefore, a rapid change in shape occurs at the boundary portion of the liquid chamber 13. As a result, stress concentration is likely to occur.

The piezoelectric body 4 is likely to crack, and the piezoelectric element is likely to be damaged, at a portion where stress is concentrated. Therefore, there is a demand for improvement in the durability of the piezoelectric element. In order to prevent cracks in the piezoelectric body 4, the thickness of the lower electrode 3 is increased at, for example, the boundary between the active region and the inactive region.

Configurations of First to Third Comparative Examples

FIGS. 2A to 2C are diagrams for describing comparative examples in the present disclosure. FIGS. 2A to 2C illustrate examples in which the thickness of a part of the lower electrode 3 has been increased in the examples illustrated in FIGS. 1A to 1C, respectively. In the lower electrode 3, a portion with an increased thickness is denoted by reference numeral 31, and a portion with a thickness that has not been increased is denoted by reference numeral 32. The portion of the lower electrode 3 with an increased thickness is also referred to as a thick portion 31. The portion of the lower electrode 3 with a thickness that has not been increased is also referred to as a thin portion 32.

In a first comparative example illustrated in FIG. 2A, the lower electrode 3 is a common electrode, and the upper electrode 5 is an individual electrode. As illustrated, the thick portion 31 of the lower electrode 3 is located at the boundary between the active region and the inactive region. In other words, the thick portion 31 of the lower electrode 3 is provided, that is, the lower electrode 3 is thicker, at a position corresponding to an end of the upper electrode 5.

In the first comparative example, the upper electrode 5 is not formed on side faces of the piezoelectric body 4. As a result, the piezoelectric body 4 may be susceptible to external damage, humidity, and the like. In addition, there is concern about deterioration of characteristics and durability.

In a second comparative example illustrated in FIG. 2B, the lower electrode 3 is an individual electrode, and the upper electrode 5 is a common electrode. Strictly speaking, the lower electrode 3 is not thicker at the boundary between the active region and the inactive region in the second comparative example, but the lower electrode 3 is thicker near (in a vicinity of) ends of the active region. In the second comparative example, the upper electrode 5 is formed on the side faces of the piezoelectric body 4. Thus, the piezoelectric body 4 is less susceptible to external damage, humidity, and the like than in the first comparative example described above.

In a third comparative example 3 illustrated in FIG. 2C, the lower electrode 3 is thicker at ends and around the ends of the liquid chamber 13. In the third comparative example, no electrode patterning has been performed.

In the first to third comparative examples described above, the height of the upper electrode 5 is uniform, and the height of the upper electrode 5 does not change even at a position where the lower electrode 3 is thicker. Therefore, the first to third comparative examples described above are disadvantageous in that the distance between the thickened lower electrode 3 and the upper electrode 5 becomes narrow, leading to dielectric breakdown. When dielectric breakdown occurs, the piezoelectric element fails.

First Embodiment (Description of First to Third Examples)

In contrast, in the present embodiment, the thickness of a part of the lower electrode 3 has been increased and in addition, a part of the upper electrode 5 has been raised above the rest of the upper electrode 5. In the present embodiment, the thickness of the lower electrode 3 is increased at a portion where stress concentration is likely to occur. Thus, rigidity is increased so as to prevent breakage of the piezoelectric body 4 and the like being driven. Furthermore, as a result of raising a part of the upper electrode 5, it is possible to set the distance between the thickened lower electrode 3 and upper electrode 5 such that the distance is equal to or greater than a certain value. Thus, a failure due to dielectric breakdown can be prevented.

First to Third Examples

Figure 3A:
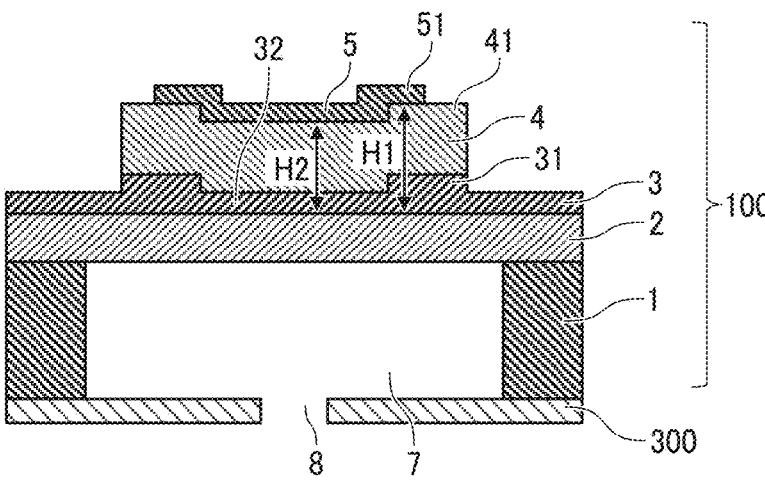
FIGS. 3A to 3C are cross-sectional schematic diagrams for describing piezoelectric actuators according to first to third examples.
Figure 3B:
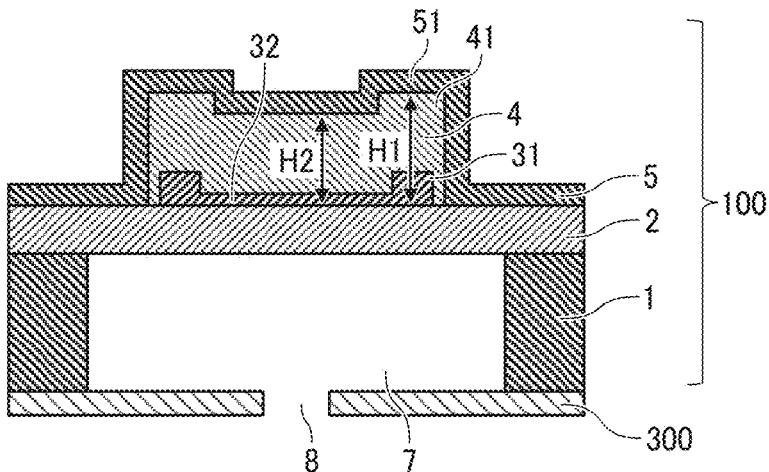
Figure 3C:
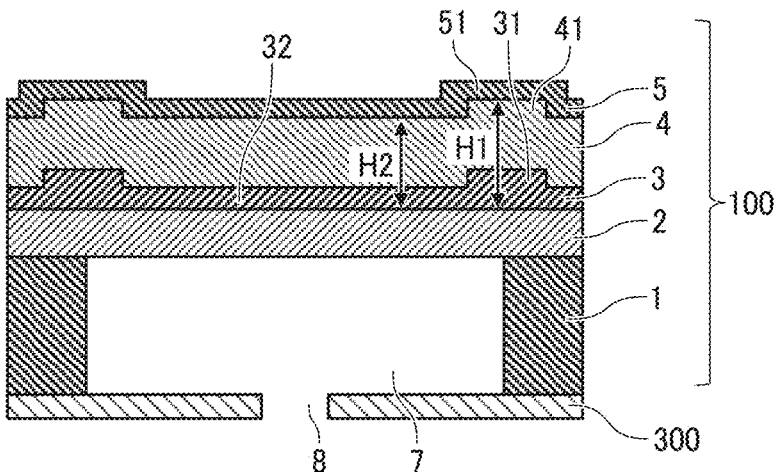

FIGS. 3A to 3C are cross-sectional schematic diagrams for describing outlines of examples of the present embodiment. FIGS. 3A to 3C illustrate first to third examples of a case where the thickness of a part of the lower electrode 3 has been increased and in addition, a part of the upper electrode 5 has been raised above the rest of the upper electrode 5 in the examples illustrated in FIGS. 1A to 1C, respectively. The reason why a part of the upper electrode 5 has been raised above the rest of the upper electrode 5 is that the thickness of a part of the piezoelectric body 4 has been increased in accordance with an increase in the thickness of a part of the lower electrode 3.

In the first example illustrated in FIG. 3A, the lower electrode 3 is a common electrode, and the upper electrode 5 is an individual electrode. As illustrated, the thick portion 31 of the lower electrode 3 is located at the boundary between the active region and the inactive region. In other words, the thick portion 31 of the lower electrode 3 is provided, that is, the lower electrode 3 is thicker, at the position corresponding to the end of the upper electrode 5. Therefore, the thick portion 31 is thicker than the thin portion 32.

The piezoelectric actuator includes: an active region having the opening, the diaphragm, the lower electrode, the piezoelectric body, and the upper electrode overlapping in the first direction; and an inactive region having at least one of the opening, the diaphragm, the lower electrode, the piezoelectric body, and the upper electrode not overlapping in the first direction, wherein the part of the lower electrode has the thick portion 31 and the part of the upper electrode has the raised portion 51 at a boundary between the active region and the inactive region.

Furthermore, in the first example, a part of the upper electrode 5 has been raised above the rest of the upper electrode 5. The raised part of the upper electrode 5 may be referred to as a raised portion 51 or the like. In the first example, it can be said that a part of the piezoelectric body 4 corresponding to the thick part of the lower electrode 3, that is, the thick portion 31, is thicker accordingly. The piezoelectric body 4 is thicker in association with the thick portion 31. As a result, the raised portion 51 has been formed on the upper electrode 5.

In the first example, H1 denotes a distance from the face of the diaphragm 2 to the raised portion 51 of the upper electrode 5 in a part of the active region where the thick portion 31 of the lower electrode 3 has been formed. Furthermore, H2 denotes a distance from the surface of the diaphragm 2 to the upper electrode 5 in a part of the active region where the thin portion 32 of the lower electrode 3 has been formed. In the first example, H1 is larger than H2.

That is, H1>H2. When this relationship is satisfied, it can be said that the piezoelectric body 4 is thicker in association with the thick portion 31, and that the raised portion 51 has been formed in the upper electrode 5.

In addition, in the first example, the thickness of a part of the piezoelectric body 4 has been increased in association with the thick portion 31 of the lower electrode 3. The part of the piezoelectric body 4 having a thickness increased in association with the thick portion 31 of the lower electrode 3 is also referred to as a raised portion 41. It can also be said that the raised portion 51 of the upper electrode 5 has been formed by the raised portion 41 of the piezoelectric body 4.

In the region corresponding to H2, it is desirable that the piezoelectric body 4 be basically flat. When the thickness of the piezoelectric body 4 is not uniform in the region corresponding to H2, it is appropriate to set H2 as an average value. Meanwhile, in the region corresponding to H1, the shape of the piezoelectric body 4 varies depending on the shape of the thick portion 31 of the lower electrode 3 and thus, there is a case where the piezoelectric body 4 is not flat. In this case, it is appropriate to set H1 as a largest value of a plurality of values of H1 (distances from the surface of the diaphragm 2 to the raised portion 51 of the upper electrode 5).

In the first example, the side faces of the piezoelectric body 4 are not covered with the upper electrode 5. Therefore, the piezoelectric body 4 may be affected by the outside. Meanwhile, the fact that the side faces of the piezoelectric body 4 are not covered with the upper electrode 5 is advantageous in that the displacement efficiency of the piezoelectric body 4 can be increased.

In the second example illustrated in FIG. 3B, the lower electrode 3 is an individual electrode, and the upper electrode 5 is a common electrode. In the second example, the lower electrode 3 is thicker in the vicinity of the end of the active region and thus, the thick portion 31 has been formed in the vicinity of the end of the active region. Furthermore, the raised portion 51 has been formed in association with the thick portion 31.

In the second example, the upper electrode 5 has been formed on the side faces of the piezoelectric body 4. As a result, the piezoelectric body 4 is less susceptible to external damage, humidity, and the like than in the first embodiment. The upper electrode 5 functions as a barrier layer. In the second example, the following relationship is also satisfied as in the first example above: H1>H2.

In the third example illustrated in FIG. 3C, the lower electrode 3 is thicker at the ends and around the ends of the liquid chamber 13. Since no electrode patterning has been performed, the third example is advantageous in that production is easier than in the first and second examples above. Furthermore, since the piezoelectric body 4 can be prevented from being affected by etching damage or the like, deterioration of dielectric characteristics can be avoided. In the third example, the following relationship is also satisfied as in the first example above: H1>H2.

In the first to third examples, the piezoelectric body 4 is thicker, that is, the raised portion 51 has been formed in the upper electrode 5, in association with the thick portion 31 of the lower electrode 3. This makes it possible to prevent failure due to dielectric breakdown.

FIGS. 3A to 3C are schematic cross-sectional views of the liquid chamber 7 taken along the short side direction. Meanwhile, the same configuration may be adopted in terms of a cross section of the liquid chamber 7 in a longitudinal direction.

Thus, the piezoelectric actuator includes: a substrate (1) having an opening (7); a diaphragm (2) having one face on the substrate (1) in a first direction, the diaphragm facing the opening (7); a lower electrode (3) on another face of the diaphragm opposite to the one face of the diaphragm in the first direction; a piezoelectric body (4) on the lower electrode in the first direction; and an upper electrode (5) on the piezoelectric body (4) in the first direction, wherein the lower electrode has a thick portion (31) on a part of the lower electrode (3), the thick portion (31) has a thickness larger than a portion other than the part of the lower electrode in the first direction, the upper electrode has a raised portion (51) on a part of the upper electrode covering at least a portion of the thick portion of the lower electrode in a second direction orthogonal to the first direction, and the raised portion (51) is raised above a rest of the upper electrode (5) in the first direction. The second direction is a lateral direction in FIGS. 3A to 3C and parallel to a plane face of the diaphragm 2.

Second Embodiment (Description of Example of Lower Electrode)

The shape of the lower electrode 3 can be appropriately selected.

Figure 4A:
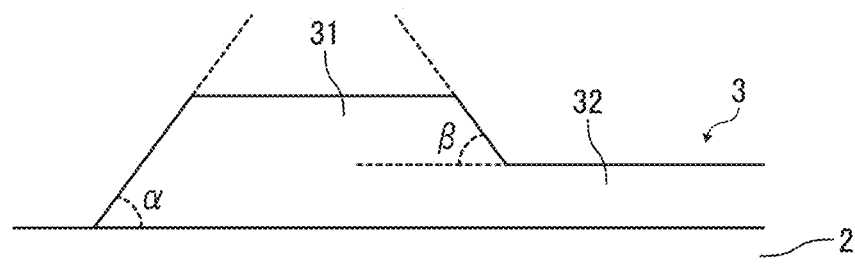
FIGS. 4A and 4B are cross-sectional schematic diagrams for describing examples of a shape of a lower electrode.
Figure 4B:
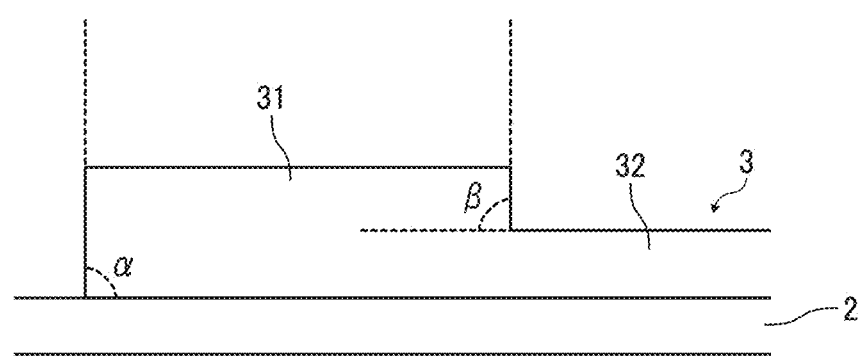

FIGS. 4A and 4B are cross-sectional schematic diagrams schematically illustrating examples of the shape of the thick portion 31. A boundary between the thick portion 31 and the thin portion 32 may change continuously as illustrated in FIG. 4A, or may change discontinuously as illustrated in FIG. 4B. In other words, the thick portion 31 may have an inclined portion as illustrated in FIG. 4A, or may have no inclined portion as illustrated in FIG. 4B. In still another expression, the thick portion 31 may have a portion where the thick portion 31 gradually decreases or increases in thickness.

As illustrated, α denotes the angle of a side face of the thick portion 31 with respect to a surface of the diaphragm 2, and β denotes the angle of a side face of the thick portion 31 with respect to a surface of the thin portion 32. As illustrated in FIG. 4A, it is desirable that α and β be slightly acute angles, and be larger than 0° and smaller than 90°.

As illustrated in FIG. 4B, when α and β are 90° (right angle), a shearing force is likely to be applied to an interface between the piezoelectric body 4 and the electrode when the piezoelectric body 4 is driven. Therefore, a failure may occur due to peeling. Furthermore, in a case where α and β are larger than 90°, a gap may be formed at exterior angles of α and β when the piezoelectric body 4 is film-formed in either spin coating or sputtering. In this case, film formation failure may occur. Therefore, in a case where α and β are slightly acute angles as illustrated in FIG. 4A, it is easy to avoid these failures.

Figure 5A:
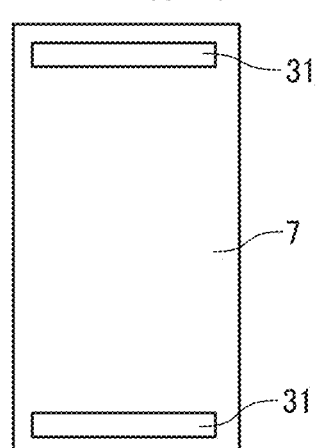
FIGS. 5A to 5E are plan schematic diagrams for describing examples of arrangement of thick portions of the lower electrode.
Figure 5B:
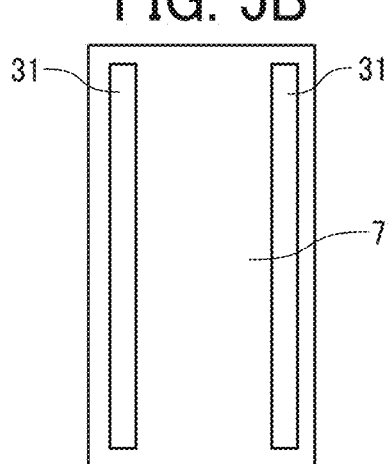
Figure 5C:
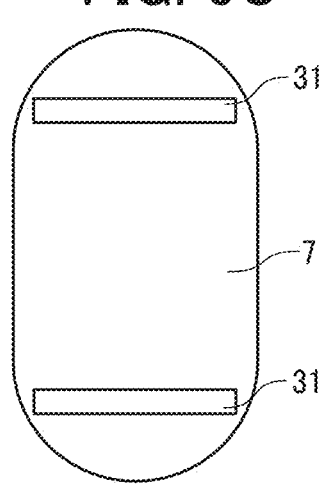

FIGS. 5A to 5E are plan schematic diagrams schematically illustrating examples of the shape of the thick portion 31, and are schematic top views of the thick portion 31. For example, as illustrated in FIGS. 5A and 5C, the thick portion 31 may have short sides along the longitudinal direction of the liquid chamber 7, and have long sides along the short side direction of the liquid chamber 7.

Figure 5D:
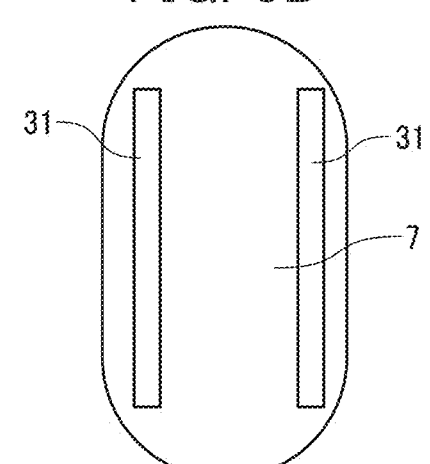

For example, as illustrated in FIGS. 5B and 5D, the thick portion 31 may have long sides along the longitudinal direction of the liquid chamber 7, and have short sides along the short side direction of the liquid chamber 7. The cross-sectional schematic diagrams of FIGS. 3A to 3C correspond to FIG. 5B or 5D. The thick portion 31 may have, for example, an annular shape as illustrated in FIG. 5E.

Figure 5E:
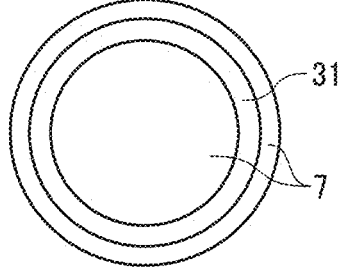

As illustrated in FIGS. 5A to 5E, the planar shape of the liquid chamber 7 can be appropriately selected. For example, the liquid chamber 7 may have long sides and short sides as illustrated in FIGS. 5A to 5D. The shape of the liquid chamber 7 is not limited thereto. The liquid chamber 7 may have a square shape or a polygonal shape other than a quadrangular shape. Furthermore, the liquid chamber 7 may have an annular shape as illustrated in FIG. 5E. Furthermore, as illustrated in FIGS. 5C and 5D, the liquid chamber 7 may have an elliptical shape.

The thick portion 31 is preferably provided at a portion where stress concentration is likely to occur, and is preferably formed along either or both of the short side and long side of the piezoelectric body 4 or the liquid chamber 7, or formed along the outer periphery of the liquid chamber 7.

Third Embodiment (Description of Detailed Example of Piezoelectric Actuator)

Next, a detailed example of the piezoelectric actuator of the present disclosure will be described.

In a piezoelectric actuator according to the present embodiment, in a case where an active region is defined as a region where the opening, the diaphragm, the lower electrode, the piezoelectric body, and the upper electrode all overlap as viewed from the first direction, the lower electrode has a first region and a second region, the first region being in the active region, the lower electrode having a thickness of a first thickness t1 in the first region, the second region being provided in such a way as to be at least partially included in the active region as viewed from the first direction, the lower electrode having a thickness of a second thickness t2 in the second region, the second thickness t2 being larger than the first thickness t1.

Furthermore, in the piezoelectric actuator according to the present embodiment, in a case where a distance t3 is defined as a distance in the first direction from the diaphragm to the upper electrode in the second region, the first region includes a region where a distance in the first direction from the diaphragm to the upper electrode is a distance t4 smaller than the distance t3.

The lower electrode has: a first region having a first thickness t1 in the first direction in the active region; and a second region, in which the thick portion is formed, having a second thickness t2 larger than the first thickness t1 in the first direction, and the piezoelectric actuator having: a distance t3 from the diaphragm to the upper electrode in the first direction in the second region; and a distance t4 from the diaphragm to the upper electrode in the first region in the first direction, the distance t4 smaller than the distance t3 in the first direction.

Fourth Example

Figure 6A:
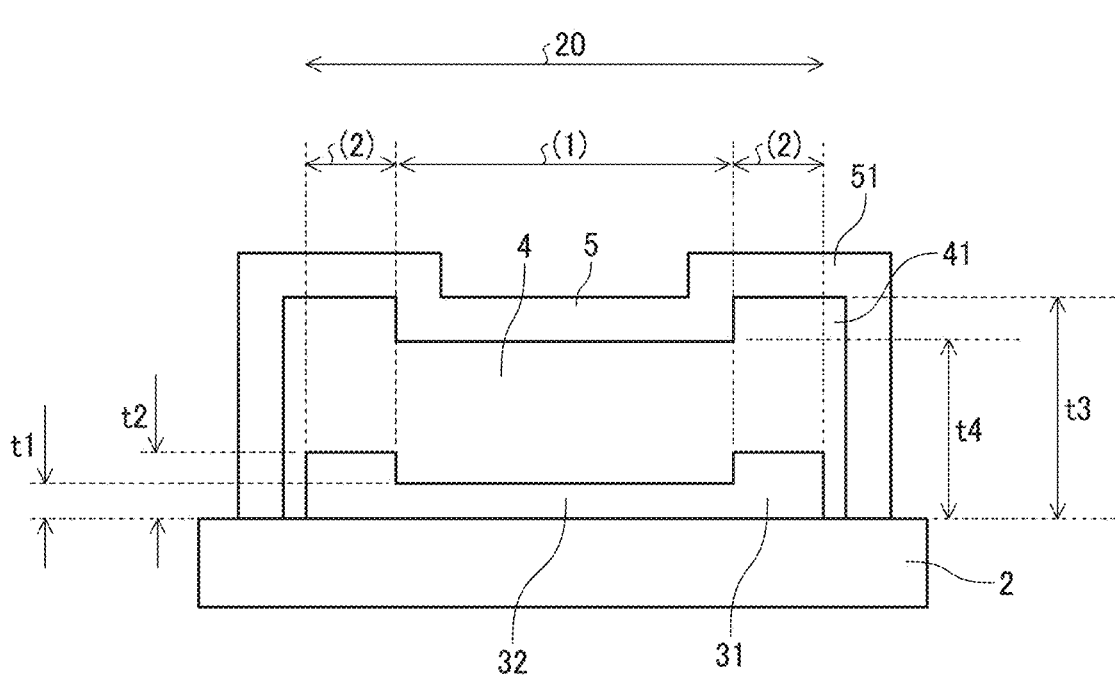
FIG. 6A is a cross-sectional schematic diagram for describing a fourth example.
Figure 6B:
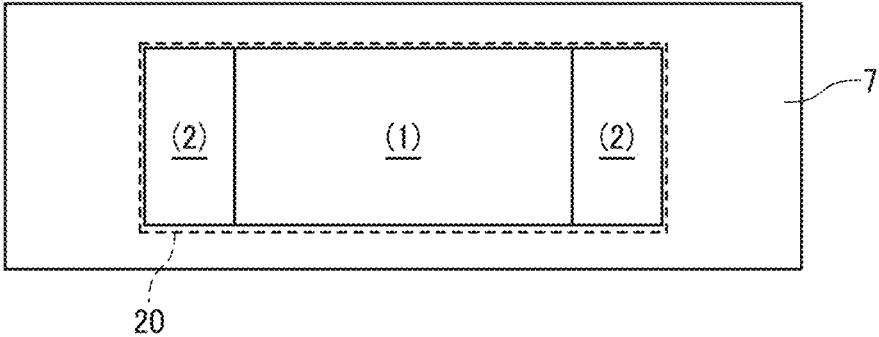
FIG. 6B is a plan schematic diagram for describing the fourth example.

FIGS. 6A and 6B are diagrams for describing a fourth example which is a detailed example of the piezoelectric actuator according to the present embodiment. FIG. 6A is a schematic cross-sectional view of a main part of the piezoelectric actuator of the fourth example. The piezoelectric actuator of the fourth example has a configuration similar to the configuration of the second example (FIG. 3B). FIG. 6B is a schematic plan view of the piezoelectric actuator of the fourth example, and is a schematic plan view of a main part of the piezoelectric actuator of the present embodiment as viewed from the first direction.

In the present embodiment, an active region 20 is defined as a region where the liquid chamber 7 (opening), the diaphragm 2, the lower electrode 3, the piezoelectric body 4, and the upper electrode 5 all overlap as viewed from the first direction, as illustrated in, for example, FIG. 6B. The active region 20 is also indicated in FIG. 6A.

The lower electrode 3 has the first region and the second region. The first region is in the active region 20. The lower electrode 3 has a thickness of the first thickness t1 in the first region. The second region is provided in such a way as to be at least partially included in the active region 20. The lower electrode 3 has a thickness of the second thickness t2 in the second region. The second thickness t2 is larger than the first thickness t1. The first region in which the lower electrode 3 has a thickness of the first thickness t1 is denoted by (1) in the drawing. The thin portion 32 corresponds to the first region in the example illustrated in the drawing. The second region in which the lower electrode 3 has a thickness of the second thickness t2 larger than the first thickness t1 is denoted by (2) in the drawing. The thick portion 31 corresponds to the second region in the example illustrated in the drawing. In the following description, the first region and the second region may be referred to as the first region (1) and the second region (2), respectively. The first region (1) may be a region in the active region 20. The second region (2) may include a region other than the active region 20.

As illustrated, the distance t3 is defined as a distance in the first direction from the diaphragm 2 to the upper electrode 5 in the second region (2). In addition, as illustrated, the distance t4 is defined as a distance in the first direction from the diaphragm 2 to the upper electrode 5 in the first region (1). In the present embodiment, the distance t4 is smaller than the distance t3. That is, the following relationship is satisfied: t4<t3. In other words, an interelectrode distance in the region (2) is larger than an interelectrode distance in the region (1).

In the present embodiment, these configurations are satisfied. Therefore, the above-described effects can be obtained. That is, in the present embodiment, the thickness of the lower electrode 3 is increased to increase rigidity at a portion where stress concentration is likely to occur. As a result, it is possible to prevent breakage of the piezoelectric body 4 and the like being driven. In addition, since a certain distance between the thickened lower electrode 3 and the upper electrode 5 is maintained, it is possible to prevent failure due to dielectric breakdown. Note that H1 and H2 described in the first embodiment will be described in detail in the third embodiment.

In the above description, the first region (1) has been defined such that the first region (1) includes a region where the distance from the diaphragm 2 to the upper electrode 5 in the first direction is the distance t4 smaller than the distance t3. The reason for this definition will be described below.

Fifth Example

Figure 7A:
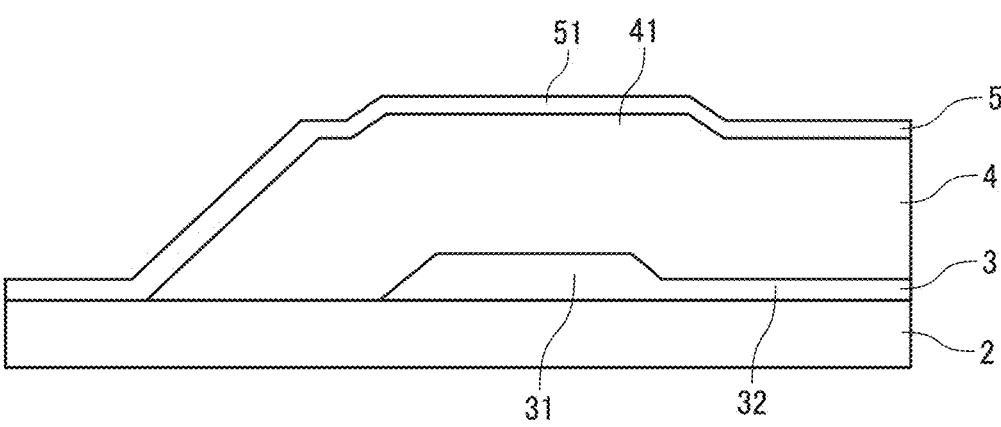
FIGS. 7A and 7B are cross-sectional schematic diagrams for describing a fifth example.
Figure 7B:
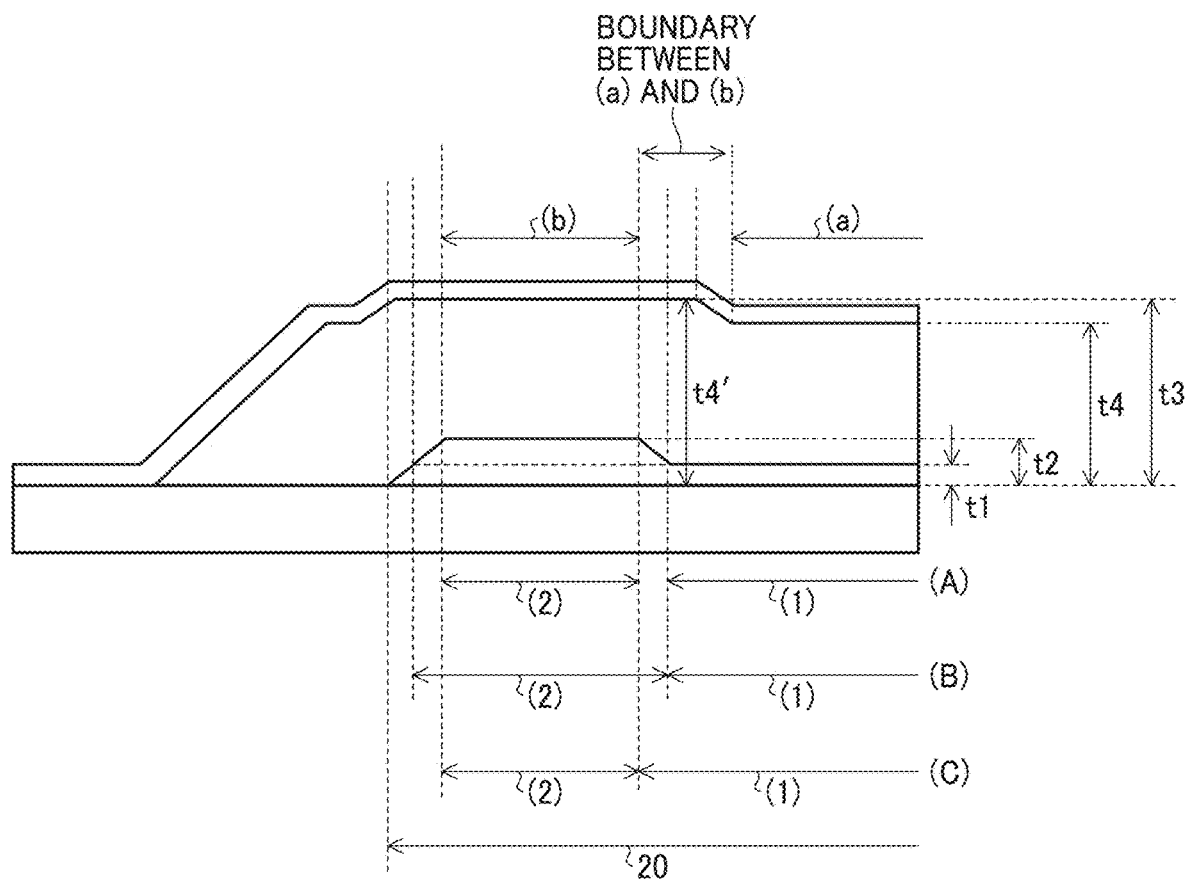

FIGS. 7A and 7B are diagrams for further describing the present embodiment, and are diagrams illustrating a fifth example. FIGS. 7A and 7B are cross-sectional schematic diagrams for describing a detailed example of, for example, FIG. 3B, and are diagrams illustrating the periphery of one end (here, a left end) of the liquid chamber 7 of FIG. 3B.

In the present disclosure, as illustrated in FIGS. 7A and 7B, side faces of the thick portion 31 of the lower electrode 3 may be inclined with respect to the first direction. Furthermore, side faces of the raised portion 41 of the piezoelectric body 4 may be inclined with respect to the first direction. Such examples are also illustrated in FIGS. 6A, 6B, 8A, and 8B to be described below. In addition, the width of the thick portion 31 of the lower electrode 3 and the width of the raised portion 41 of the piezoelectric body 4 can be appropriately changed. Note that the term "width" here refers to distance in a left-right direction of FIGS. 7A and 7B.

Therefore, in the case of a piezoelectric actuator as illustrated in, for example, FIG. 7A or 7B, there may be several variations of locations of the first region (1) and the second region (2) for a single piezoelectric actuator. Note that t1 to t4 have been added to FIG. 7A, the first region (1) and the second region (2) have been indicated, and reference numerals of the lower electrode and the like have been omitted from FIG. 7A to obtain FIG. 7B.

As described above, the first region (1) is a region in which the lower electrode 3 has a thickness of the first thickness t1 in the active region 20. In addition, the second region (2) is a region in which the lower electrode 3 has a thickness of the second thickness t2 larger than the first thickness t1 in the active region 20. That is, the following relationship is satisfied: t2>t1. Therefore, when the side faces of the thick portion 31 of the lower electrode 3 are inclined with respect to the first direction (for example, FIG. 7A), there are possible interpretations (A) to (C) as illustrated in FIG. 7B.

Even if the interpretations (A) to (C) are made, there are regions (a) and (b) where t3>t4, in the present embodiment. Therefore, the first region (1) has been defined such that the first region (1) includes a region where the distance from the diaphragm 2 to the upper electrode 5 in the first direction is the distance t4 smaller than the distance t3. This will be described below.

In the case of (A), there is a region where the distance from the diaphragm 2 to the upper electrode 5 in the first direction is a distance t4' in the first region (1) where the lower electrode 3 has a thickness of t1. The distance t4' is equal to the distance t3. This may lead to an interpretation to the effect that the following definition is not satisfied in the first region (1): distance t4<distance t3, but this is not the case.

In the case of (A), the region (a) exists in the first region (1), and the region (b) exists in the second region (2). Comparing the region (a) and the region (b), the distance t4 in the region (a) and the distance t3 in the region (b) satisfy the following definition: distance t4<distance t3. Therefore, the region (a) corresponds to a region where the distance from the diaphragm 2 to the upper electrode 5 in the first direction is the distance t4 smaller than the distance t3. Since the region (a) is a region included in the first region (1), the first region (1) includes a region where the distance from the diaphragm 2 to the upper electrode 5 in the first direction is the distance t4 smaller than the distance t3.

Roughly speaking, height (distance) in the region (b) is defined as being larger than height (distance) in the region (a) in the present embodiment. Since the first region (1) has the region (a) as described above, and the second region (2) has the region (b) as described above, a failure such as dielectric breakdown can be prevented.

The same applies to the cases of (B) and (C) as in the case of (A). The first region (1) includes a region where the distance is equal to the distance t4', and simultaneously includes the region (a) where the distance t4<the distance t3.

Therefore, the first region (1) includes a region where the distance from the diaphragm 2 to the upper electrode 5 in the first direction is the distance t4 smaller than the distance t3.

Sixth Example

Next, another example of the present embodiment will be described with reference to FIGS. 8A and 8B.

As described above with reference to FIGS. 7A and 7B, in the present embodiment, the lower electrode 3 and the piezoelectric body 4 may have an inclined portion in a cross section. Therefore, there is a case where the distance from the diaphragm 2 to the upper electrode 5 in the first direction corresponds to an inclined portion in the first region (1). A sixth example illustrated in FIGS. 8A and 8B is an example for describing this case. To tell the conclusion first, since the first region (1) includes the region (a) even in this case, the definition of the present embodiment is satisfied.

Figure 8A:
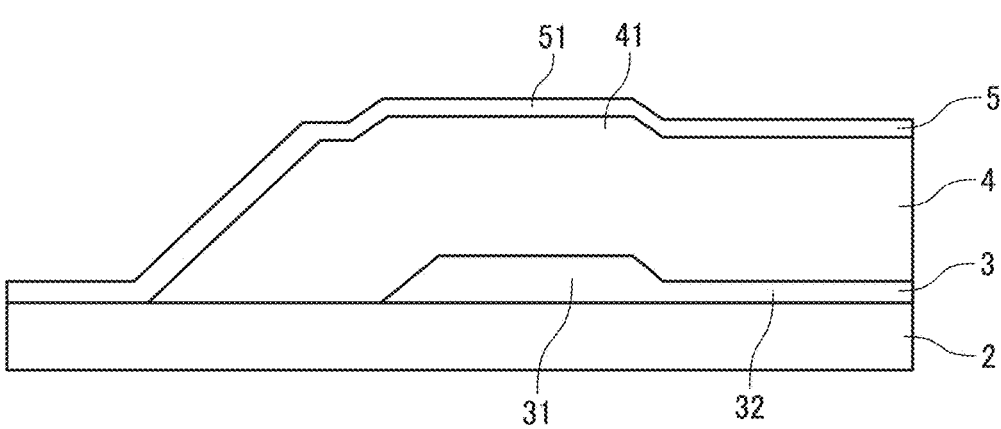
FIGS. 8A and 8B are cross-sectional schematic diagrams for describing a sixth example.

FIG. 8A is a schematic cross-sectional view of the present example, as with FIG. 7A. In order to obtain FIG. 8B, t1 to t4 have been added to FIG. 8A, the first region (1) and the second region (2) have been indicated, and the reference numerals of the lower electrode and the like have been omitted from FIG. 8A.

Figure 8B:
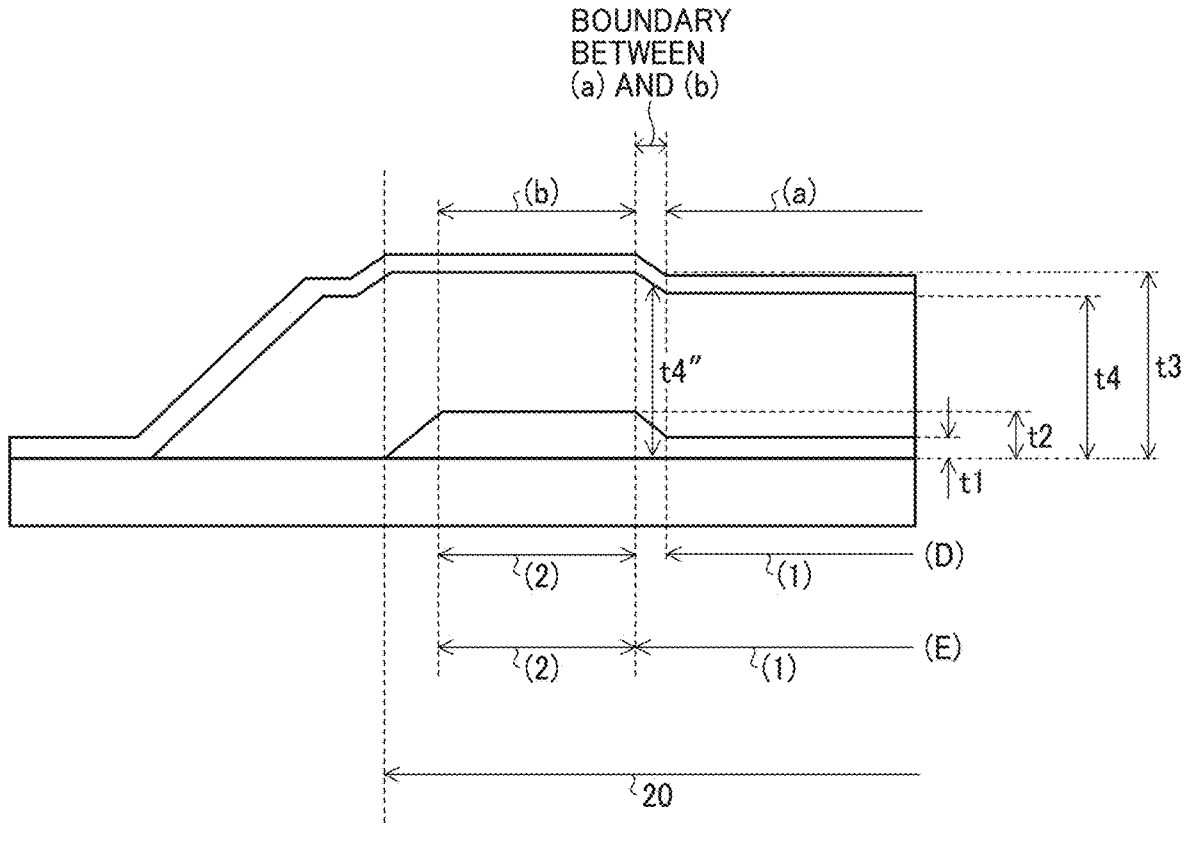

As illustrated in FIGS. 8A and 8B, an inclined side face of the thick portion 31 in the lower electrode 3 and an inclined side face of the raised portion 41 in the piezoelectric body 4 exist at the same position or substantially the same position in a width direction (left-right direction in the drawing). In the present example, the positional relationship between the first region (1) and the second region (2) can be interpreted as (D) and (E), as illustrated in FIG. 8B.

In the case of (D), the first region (1) is a region where the distance from the diaphragm 2 to the upper electrode 5 in the first direction is the distance t4 smaller than the distance t3. Thus, the definition of the present embodiment is satisfied.

In the case of (E), the first region (1) has a region where the distance from the diaphragm 2 to the upper electrode 5 in the first direction is a distance t4". The distance t4" is defined as a distance (height) of a portion where the piezoelectric body 4 is inclined. Thus, the distance from the diaphragm 2 to the upper electrode 5 in the first direction is not uniquely determined in the first region (1) of the present example. Therefore, it is likely to be interpreted as unclear whether the definition of the present embodiment is satisfied, but this is not the case.

For example, as in the case of (A) above, the first region (1) includes the region (a) even in the case of (E). Also in the example illustrated in FIGS. 8A and 8B, the region (a) exists in the first region (1), and the region (b) exists in the second region (2). Comparing the region (a) and the region (b), the distance t4 in the region (a) and the distance t3 in the region (b) satisfy the following definition: distance t4<distance t3. Therefore, the region (a) corresponds to a region where the distance from the diaphragm 2 to the upper electrode 5 in the first direction is the distance t4 smaller than the distance t3. Since the region (a) is a region included in the first region (1), the first region (1) includes a region where the distance from the diaphragm 2 to the upper electrode 5 in the first direction is the distance t4 smaller than the distance t3.

Fourth Embodiment (Description of Further Detailed Example of Piezoelectric Actuator)

Next, a supplementary or further detailed example of the piezoelectric actuator of the above embodiment will be described.

Description 1

For example, as illustrated in FIGS. 7A, 7B, 8A, and 8B, the distance t3 in the first direction from the diaphragm 2 to the upper electrode 5 in the second region (2) is larger than a distance in the first direction from the diaphragm 2 to the upper electrode 5 in the rest of the active region 20. In other words, it can be said that the raised portion 51 of the upper electrode 5 is higher than the rest of the upper electrode 5. In this case, an interelectrode distance is easily maintained in the second region (2), so that dielectric breakdown is more easily prevented.

In the case of (C) of FIG. 7B, the first region (1) includes the raised portion 51 of the upper electrode 5. However, since the height of the upper electrode 5 is higher in the region (b) than in the region (a), the definition of description 1 is satisfied. Therefore, description 1 may include a definition to the effect that the upper electrode 5 includes a region in which the upper electrode 5 is higher in a height direction in the second region (2) than in the rest of the active region 20.

Thus, the distance t3 is larger than a distance from the diaphragm to the upper electrode in the first direction in the first region.

Description 2

As illustrated in, for example, FIGS. 3B, 7A, 7B, 8A, and 8B, the upper electrode 5 and the piezoelectric body 4 are provided in such a way as to include the first region (1) and the second region (2) in the active region 20 when viewed in a cross section along the first direction.

The upper electrode and the piezoelectric body cover the first region and the second region in the active region in the second direction.

In this case, the piezoelectric body 4 formed in the second region (2) is covered with the upper electrode 5. Thus, the piezoelectric body 4 is protected. Therefore, it is possible to prevent the piezoelectric body 4 from being corroded by moisture or the like in the air in the second region (2) where the piezoelectric body 4 is likely to be affected by the outside. Furthermore, according to the present configuration, it is possible to dispose the upper electrode 5 such that the end of the upper electrode 5 does not overlap the lower electrode 3 in the first direction. Therefore, dielectric breakdown of the piezoelectric body 4 can be further prevented between the end of the upper electrode 5 and the thick portion 31 of the lower electrode 3.

Figure 9:
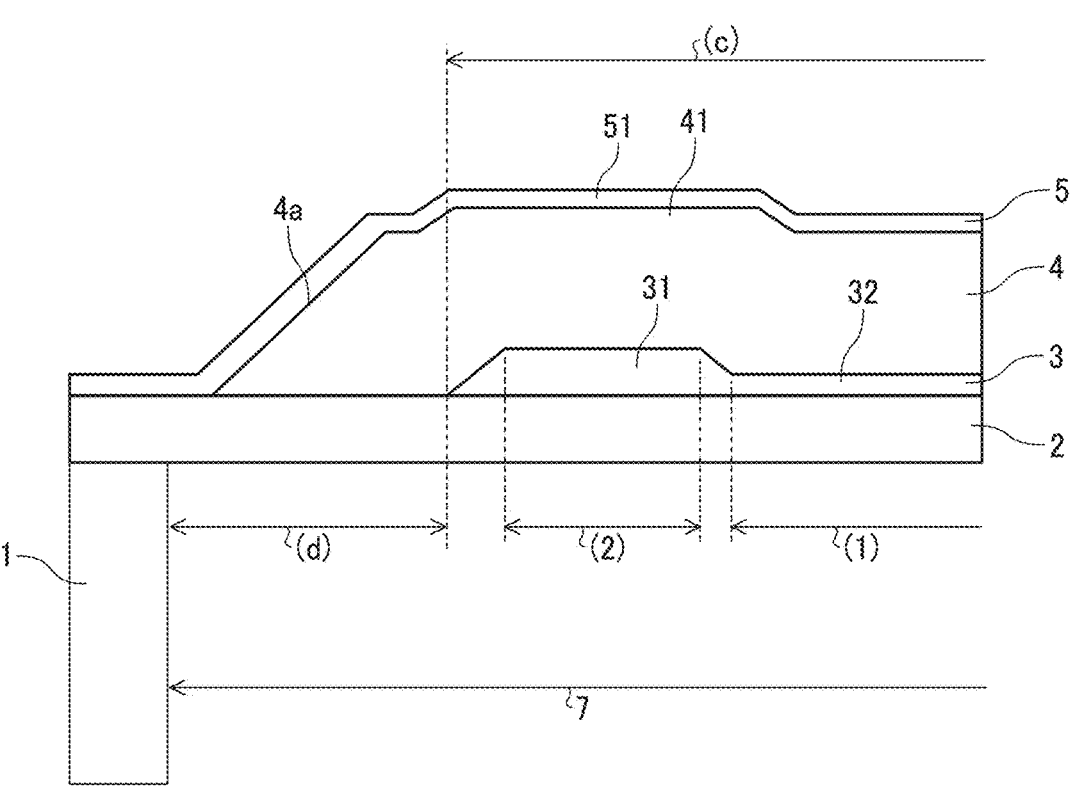
FIG. 9 is a cross-sectional schematic diagram for describing a detailed example of the second, fifth, and sixth examples.

This configuration will be supplementarily described with reference to FIG. 9. FIG. 9 is a cross-sectional schematic diagram similar to FIGS. 7A, 7B, 8A, and 8B, and is a cross-sectional view taken along the first direction. A region (c) in the drawing is a region including the first region (1) and the second region (2) in the active region 20. A region (d) in the drawing is a region located on the inner side of the liquid chamber 7 (opening) and outside the active region 20.

As illustrated, the end of the upper electrode 5 is not disposed in the second region (2). In addition, the piezoelectric body 4 is covered with the upper electrode 5 in the second region (2). Furthermore, a side face portion 4a (may be referred to as a side face, a side wall portion, or the like.) of the piezoelectric body 4 is covered with the upper electrode 5. Therefore, the effect of protecting the piezoelectric body 4 is improved.

This preferable configuration will be described again. As illustrated, the piezoelectric body 4 preferably has the side face portion 4a in the region (d) on the inner side of the liquid chamber 7 (opening), the region (d) being located outside the region (c) including the first region (1) and the second region (2) as viewed in a cross section along the first direction, and the side face portion 4a of the piezoelectric body 4 is preferably covered with the upper electrode 5. As a result, the side face portion 4a of the piezoelectric body 4 can be protected by the upper electrode 5. Thus, the piezoelectric body 4 can be prevented from being damaged by moisture or the like in the air.

The piezoelectric body has a side face disposed: inside the opening in the second direction; and outside the first region and the second region in the second direction, and the upper electrode covers the side face of the piezoelectric body.

Description 3

Next, a detailed example of the example illustrated in FIG. 3A will be described.

The piezoelectric body 4 is provided in such a way as to overlap the first region (1) and a part of the second region (2) in the first direction when viewed in a cross section along the first direction. The upper electrode 5 is formed such that the piezoelectric body 4 formed in a part of the second region (2) and an end of the upper electrode 5 overlap in the first direction, and that a portion formed in the first region (1) and a portion formed in the second region (2) are coupled to each other.

In the present example, the end of the upper electrode 5 is disposed in the second region (2), and the upper electrode 5 is not provided on a part of the upper face of the piezoelectric body 4 in the second region (2). As a result, since the active region is limited to a part of the thick portion 31 (second region (2)), it is possible to reduce stress to be generated in the piezoelectric body 4 in the second region (2). Therefore, it is possible to prevent damage to the piezoelectric body 4 and the diaphragm 2 in the second region (2). Furthermore, since the end of the upper electrode 5 where discharge or the like is likely to occur is disposed in such a way as to be higher than in the example illustrated in, for example, FIG. 9, discharge between the end of the upper electrode 5 and the thick portion 31 of the lower electrode 3 can be easily prevented.

The piezoelectric body covers the first region and a part of the second region in the second direction, and the upper electrode has an end covering a part of the piezoelectric body in the second region in the second direction, a portion of the upper electrode in the first region is coupled to a portion of the upper electrode in the second region.

Figure 10:
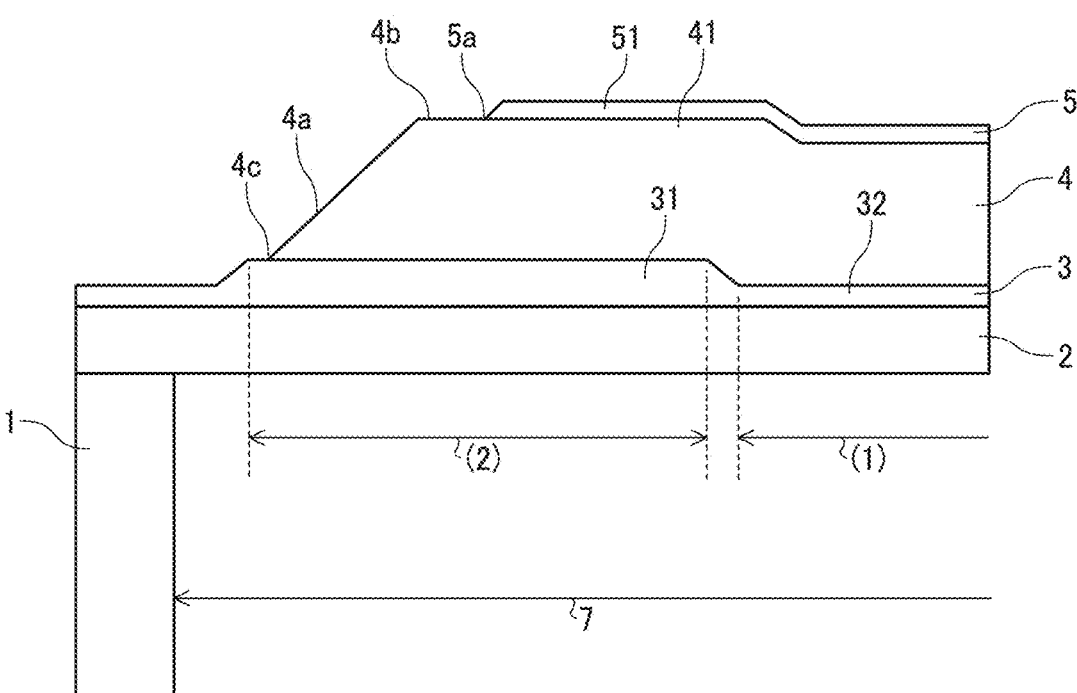
FIG. 10 is a cross-sectional schematic diagram for describing a detailed example of the first example.

This configuration will be described with reference to FIG. 10. FIG. 10 is a cross-sectional schematic diagram similar to FIG. 9 and the like, and is a cross-sectional view taken along the first direction.

As illustrated, an end 5a of the upper electrode 5 is disposed on the piezoelectric body 4 formed in a part of the second region (2). Therefore, the height (height in the height direction described above) of the end 5a of the upper electrode 5 is larger than in the example illustrated in, for example, FIG. 9. Thus, damage due to discharge or the like is easily prevented.

As illustrated, a region where the upper electrode 5 is not formed exists on the upper face of the piezoelectric body 4 located outside the upper electrode 5 (a region 4b in the drawing). Since this region serves as an inactive region, stress decreases. In addition, the side face portion 4a of the piezoelectric body 4 is formed in the second region (2), and the upper electrode 5 is not formed on the side face portion 4a, as illustrated. That is, unlike the above-described example illustrated in FIG. 9, the upper electrode 5 is not formed on the side face portion 4a of the piezoelectric body 4 and the region 4b, which is a part of the upper face of the piezoelectric body 4, in the present example. However, since the side face portion 4a and the region 4b are located in the inactive region, the influence on the driving of the piezoelectric element can be reduced even when the piezoelectric body 4 are not protected by the upper electrode 5 in the side face portion 4a and the region 4b.

The piezoelectric body has a side face in the second region, and the upper electrode does not cover the side face.

In the present example, the side face portion 4a of the piezoelectric body 4 is disposed on the thick portion 31 (second region (2)) of the lower electrode 3. As a result, even when stress concentrates on the diaphragm 2 near (in a vicinity of) the end (side face portion 4a) of the piezoelectric body 4, damage to the diaphragm 2 can be prevented because the lower electrode 3 is thicker. Furthermore, since the upper electrode 5 is not formed on the side face portion 4a of the piezoelectric body 4, the side face portion 4a of the piezoelectric body 4 can be disposed in the second region (2).

Thus, the piezoelectric actuator includes an active region having the opening, the diaphragm, the lower electrode, the piezoelectric body, and the upper electrode overlapping in the first direction, and the part of the lower electrode has the thick portion and the part of the upper electrode has the raised portion in a vicinity of an end of the active region in the second direction.

A part of the illustrated configuration of the present example will be described again.

In the piezoelectric body 4 in the present example, when viewed in a cross section along the first direction, the side face portion 4a of the piezoelectric body 4 is formed in the second region (2), and the upper electrode 5 is not formed on the side face portion 4a. In this case, since the end of the piezoelectric body 4 is covered with no electrode, the displacement efficiency of the piezoelectric body 4 can be increased. In addition, the side face portion 4a of the piezoelectric body 4 can be disposed in the second region (2), as described above.

Each of the lower electrode, the piezoelectric body, and the upper electrode is disposed across an end of the opening in the substrate in the second direction, and at least a part of the end of the opening is in the second region.

Description 4

Next, a supplement will be described for the example illustrated in FIG. 3C.

At the end of the liquid chamber 7 (opening), the lower electrode 3, the piezoelectric body 4, and the upper electrode 5 are at least partially formed from an inner side toward an outer side of the opening as viewed from the first direction, and at least a part of the end of the opening is in the second region (2).

In the present example, the lower electrode 3 is thicker at the end of the opening (for example, the liquid chamber 7). That is, as illustrated, the thick portion 31 of the lower electrode 3 is provided at the end of the liquid chamber 7. Since stress tends to concentrate at the end of the opening, it is possible to prevent the piezoelectric body 4 from being damaged at the end of the opening by thickening the lower electrode 3 at the end of the opening.

Note that the expression "as viewed from the first direction" has been used in the above description, but the configuration of the present example can also be recognized when viewed in a cross section along the first direction. Therefore, the configuration of the present example can also be recognized in FIG. 3C.

Figure 11:
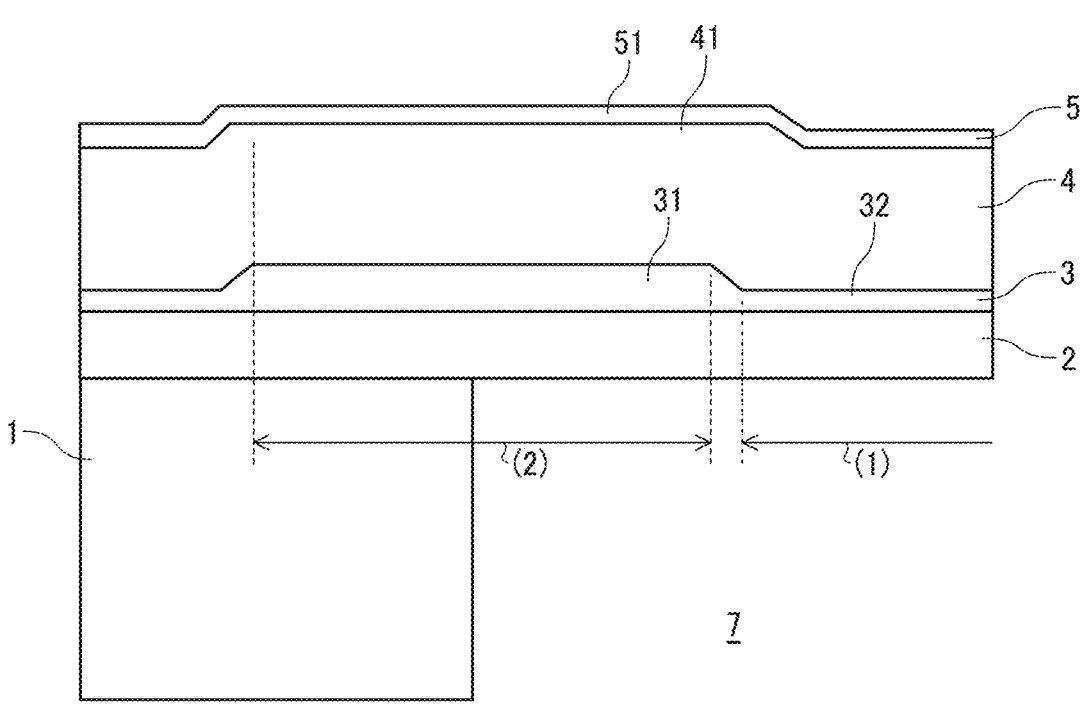
FIG. 11 is a cross-sectional schematic diagram for describing a detailed example of the third example.

FIG. 11 is an enlarged schematic view of a main part for describing the present example. As illustrated, the lower electrode 3, the piezoelectric body 4, and the upper electrode 5 are formed from the inner side toward the outer side of the liquid chamber 7 at the end of the liquid chamber 7. Furthermore, in the illustrated cross section, the end of the liquid chamber 7 is in the second region (2).

Portions of the lower electrode 3, the piezoelectric body 4, and the upper electrode 5 formed from the inner side toward the outer side of the liquid chamber 7 at the end of the liquid chamber 7 can be appropriately selected. As illustrated in FIG. 3C, both ends in the short side direction of the liquid chamber 7 may be configured as described above. Alternatively, one end may be configured as described above. In addition, such a configuration may be employed at an end of the liquid chamber 7 in the longitudinal direction.

Description 5

Next, a description will be given of a preferred relationship between the thicknesses t1 and t2 and the distances t3 and t4.

A difference (t3–t4) between the distance t3 and the distance t4 is preferably smaller than a difference (t2–t1) between the second thickness t2 and the first thickness t1. That is, it is preferable to satisfy t3–t4<t2–t1.

This relationship will be described with reference to FIG. 7B, for example.

The relationship "t3–t4<t2–t1" corresponds to a relationship in which the height of the raised portion 41 of the piezoelectric body 4 is smaller than the height of the thick portion 31 of the lower electrode 3. Here, the height of the raised portion 41 of the piezoelectric body 4 refers to a height from the piezoelectric body 4 in the region (a) serving as a base, that is, a height from a flat portion serving as a base. Here, the height of the thick portion 31 of the lower electrode 3 refers to a height from the thin portion 32 serving as a base.

As a result of satisfying this relationship, it is possible to reduce the strength of an electric field to be applied to the piezoelectric body 4, and to reduce stress concentration on the piezoelectric body 4. Therefore, formation of the thick portion 31 of the lower electrode 3 makes it possible to obtain a more effective configuration together with the effect of preventing damage to the piezoelectric body 4.

[Method for Manufacturing Piezoelectric Actuator]

A description will be given of an example of a method for manufacturing the piezoelectric actuator according to the present disclosure.

For example, a silicon single crystal substrate having a plane orientation (110) (a plate thickness of, for example, 400 µm) is used as the liquid chamber substrate 1. The silicon plane orientation of the liquid chamber substrate 1 is not limited to (110). A silicon plane orientation suitable for flowing in a subsequent step may be selected.

The diaphragm 2 is film-formed on the liquid chamber substrate 1.

The diaphragm 2 is produced by use of, for example, an LP-CVD method. For example, a silicon oxide film and a silicon nitride film are layered to produce the diaphragm 2. The material to be used at this time can be appropriately selected. Other materials such as silicon and zircon oxide may be used. Alternatively, other elements may be implanted for stress control. Alternatively, an active layer of a silicon-on-insulator (SOI) wafer may be used.

The material and thickness of the diaphragm 2 can be appropriately selected according to performance necessary for a droplet discharge head. The material of the diaphragm 2 is preferably a material having a Young's modulus in the range of, for example, 50 GPa to 180 GPa. The thickness of the diaphragm 2 is preferably in the range of 1 µm to 5 µm. It is more desirable to simultaneously satisfy the above Young's modulus and the above thickness.

It is possible to increase the rigidity of the diaphragm 2 by increasing the Young's modulus of the material of the diaphragm 2 and increasing the thickness of the diaphragm 2. However, when the Young's modulus is too high and the diaphragm 2 is too thick, it is necessary to increase a voltage to be applied for deformation of the piezoelectric element. Meanwhile, when the Young's modulus of the material of the diaphragm 2 is reduced and the thickness of the diaphragm 2 is reduced, the diaphragm 2 is easily deformed. Thus, it is possible to reduce a voltage to be applied for deformation of the piezoelectric element. However, the rigidity of diaphragm 2 decreases, so that diaphragm 2 is easily damaged. Therefore, when the above Young's modulus and the above thickness are simultaneously satisfied, it is possible to keep voltage for driving the piezoelectric element within an appropriate range while maintaining the rigidity of the diaphragm 2.

Next, the lower electrode 3 is film-formed on the diaphragm 2. When the thickness of the lower electrode 3 is too large, displacement of the piezoelectric element is hindered, and when the thickness of the lower electrode 3 is too small, resistance is increased. Therefore, the thickness of the lower electrode 3 is preferably in the range of 50 nm to 200 nm.

The lower electrode 3 is subjected to desired patterning. In order to form the thick portion 31, it is preferable to perform patterning in two steps. For example, in the first patterning, the lower electrode 3 is etched by about 50 nm, except for a portion corresponding to the thick portion 31. Thereafter, in the second patterning, an unnecessary part of the lower electrode 3 is completely removed. In this way, the thick portion 31 is formed such that the thick portion 31 is thicker than the rest of the lower electrode 3 by about 50 nm.

The thick portion 31 is preferably formed such that the thick portion 31 is thicker than the rest of the lower electrode 3 by 1 nm or more and 130 nm or less. For example, when the thick portion 31 is formed such that the thick portion 31 is thicker than the rest of the lower electrode 3 by about 50 nm, the bending rigidity of the lower electrode 3 can be increased by about 4%. Therefore, it is possible to further prevent damage due to local stress concentration.

Examples of the material of the lower electrode 3 include metals such as Pt, Ti, Au, Cu, and Ir, and alloys containing these metals. In addition, a conductive oxide such as $IrO_2$, $InO_2$, or $SnO_2$, or a composite oxide made of these conductive oxides may be used as the material of the lower electrode 3. The material of the lower electrode 3 is preferably Pt from the viewpoint of ease of production of the thick portion 31.

For example, in the second example above (FIG. 3B), the thick portion 31, which is a thickened part of the lower electrode 3, has a thickness of 200 nm, and the thin portion 32, the thickness of which has not been increased in the lower electrode 3, has a thickness of 150 nm. A method for adjusting the thicknesses of the thick portion 31 and the thin portion 32 can be appropriately selected. For example, when it is desired to make the thick portion 31 thicker, it is possible to adjust a final thickness by setting an initial film formation amount to a value greater than, for example, 200 nm.

The order of patterning and formation of the piezoelectric body 4 can be appropriately changed.

In the second example above, the lower electrode 3 is used as an individual electrode. Thus, the piezoelectric body 4 is film-formed after the lower electrode 3 is patterned.

When the lower electrode 3 is used as a common electrode as in the first example above (FIG. 3A) patterning can be performed as follows, for example. After the first patterning of the lower electrode 3, the piezoelectric body 4 and the upper electrode 5 are film-formed, and the upper electrode 5 and the piezoelectric body 4 are patterned. Then, the second patterning of the lower electrode 3 is performed.

In this manner, it is possible to produce the piezoelectric actuators as in the first and second examples above by appropriately changing the order of the steps.

Next, the piezoelectric body 4 is formed. For example, lead zirconate titanate (PZT) can be used as the piezoelectric body 4. As the piezoelectric body 4, for example, PZT is deposited in a plurality of steps by spin coating or the like such that the thickness of the piezoelectric body 4 finally reaches 2 µm, for example. Although an example of using lead zirconate titanate (PZT) as the material of the piezoelectric body 4 has been cited above, any dopant may be added to PZT. Examples of the dopant include Nb, Mn, and Ce. Furthermore, the composition of lead, titanium, and zirconium in PZT may be appropriately adjusted according to desired piezoelectricity or a manufacturing method. The ratio of titanium to zirconium may be 52:48, which is the composition of the morphotropic phase boundary, or may be adjusted according to desired characteristics and a manufacturing method in the range of 42:58 to 62:38.

The method for film-forming the piezoelectric body 4 is not limited to the sol-gel method using a spin coating technique. The piezoelectric body 4 may be film-formed by, for example, a sputtering method, an ion plating method, an aerosol method, or an inkjet method.

An example of a case where the piezoelectric body 4 is film-formed by the sol-gel method will be described.

A PZT precursor is layered on the lower electrode 3 and fired. At this time, firing is performed in three steps of, for example, drying (120° C.), calcining (380° C.), and firing (700° C.). As a result, the piezoelectric body 4 on the lower electrode 3 has good crystallinity with PZT (100). Then, the piezoelectric body 4 and the upper electrode 5 are formed by a litho-etch method at a position corresponding to the liquid chamber 7 to be formed later.

Next, the upper electrode 5 is formed. As the upper electrode 5, strontium ruthenate (SRO) and Pt are deposited by, for example, the sputtering method in thicknesses of 40 nm and 100 nm, respectively. The material of the upper electrode 5 may be a metal such as Pt, Ti, Au, Cu, or Ir, or an alloy containing these metals. Alternatively, the material of the upper electrode 5 may be a conductive oxide such as IrO$_2$, InO$_2$, or SnO$_2$, or a composite oxide made of these conductive oxides.

The piezoelectric body 4 film-formed by spin coating is formed in such a way as to be raised at the thick portion 31. Thus, the piezoelectric body 4 is formed in such a way as to be slightly raised above the rest of the piezoelectric body 4. That is, the raised portion 41 of the piezoelectric body 4 is formed. When the upper electrode 5 is formed thereon, the raised portion 51 of the upper electrode 5 is formed. As a result, the lower electrode 3 and the upper electrode 5 are prevented from being locally too close to each other, and can be film-formed in the state of being kept at a certain distance.

In the case of the comparative examples, the thick portion 31 is formed such that a height from the thin portion 32 of the lower electrode 3 is, for example, 50 nm, and the piezoelectric body 4 which is flat is deposited thereon by 2 µm. When the upper electrode 5 is formed, the raised portion 51 is not formed. In this case, the distance from the thick portion 31 of the lower electrode 3 to the upper electrode 5 is 1.95 µm. In this case, the strength of the electric field increases by about 3%. It is known that an increase in the strength of the electric field exponentially increases time-dependent dielectric breakdown (TDDB) until dielectric breakdown occurs, which leads to a decrease in the life of a piezoelectric element or a piezoelectric actuator.

In the present example, for example, the thick portion 31 is formed such that the height from the thin portion 32 of the lower electrode 3 is 50 nm, and the piezoelectric body 4 is formed in such a way as to be higher by about 20 nm than in the comparative examples described above at a portion corresponding to the thick portion 31. When the upper electrode 5 is formed, the raised portion 51 is formed. In this case, the distance from the thick portion 31 of the lower electrode 3 to the upper electrode 5 is 1.97 µm. In this case, the increase in the strength of the electric field can be reduced to about 1.5%. Therefore, it is possible to prevent an increase in TDDB until dielectric breakdown occurs. Thus, it is possible to prevent a decrease in the life of the piezoelectric element or the piezoelectric actuator.

In the case of forming the piezoelectric body 4, the raised portion 41 of the piezoelectric body 4 can be formed even in film formation other than the spin coating method.

The coatability of the thick portion 31 of the lower electrode 3 is affected by, for example, the concentration of a precursor fluid at the time of formation of the piezoelectric body 4. Furthermore, the coatability of the thick portion 31 of the lower electrode 3 tends to be improved as the thickness of the film-formed piezoelectric body 4 increases. Therefore, for the coatability of the thick portion 31 of the lower electrode 3, it is preferable to consider the thickness of the piezoelectric body 4 in addition to conditions for production of the piezoelectric body 4.

In a case where a sufficient distance between the lower electrode 3 and the upper electrode 5 cannot be maintained in the above method, patterning may be performed on the surface of the piezoelectric body 4 to form the raised portion 41 of the piezoelectric body 4.

Figure 12A:
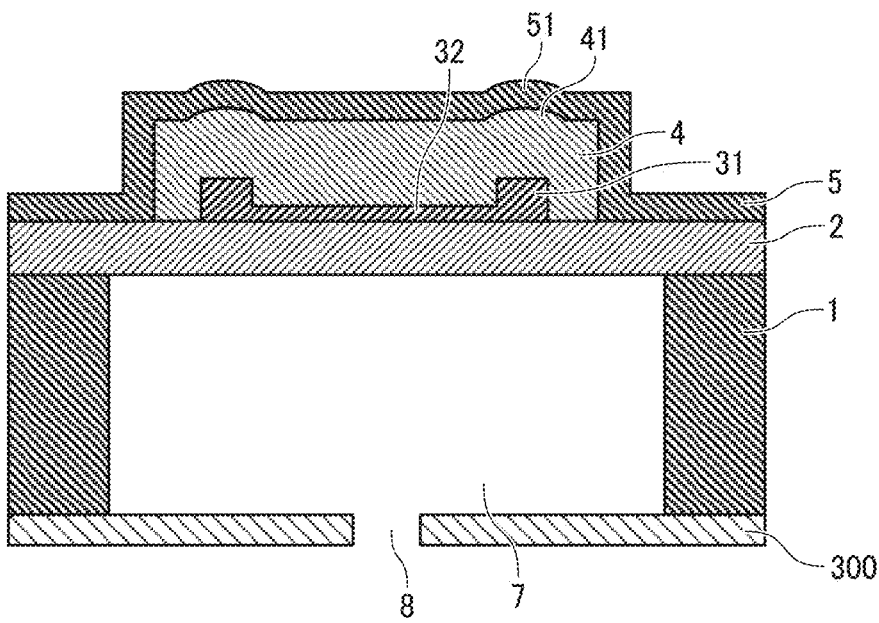
FIGS. 12A and 12B are cross-sectional schematic diagrams for describing a raised portion.
Figure 12B:
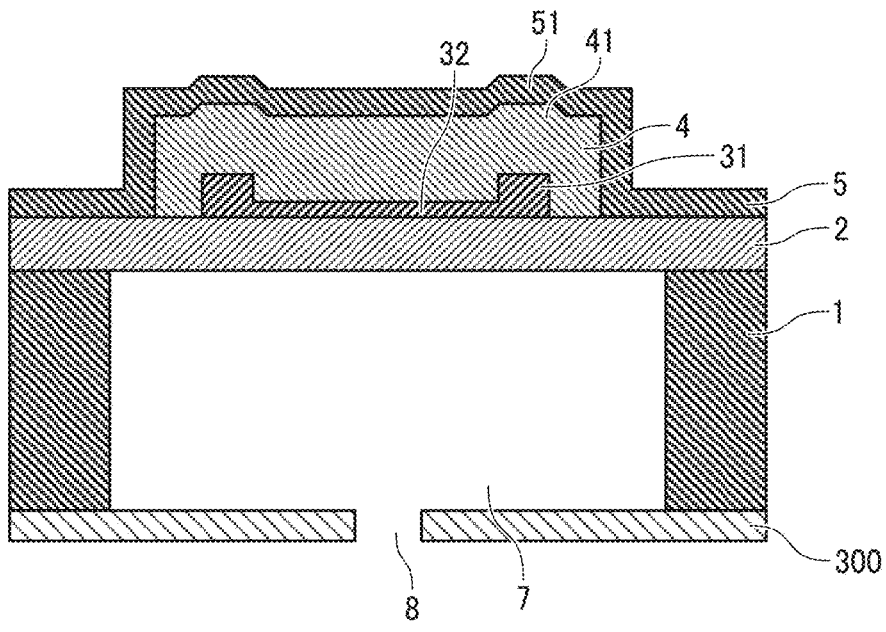

FIGS. 12A and 12B are cross-sectional schematic diagrams for describing examples of the shape of the raised portion 41 of the piezoelectric body 4. FIG. 12A is a diagram illustrating an example of a case where the raised portion 41 of the piezoelectric body 4 has been formed by use of a spin coating method. FIG. 12B is a diagram illustrating an example of a case where the raised portion 41 of the piezoelectric body 4 has been formed by use of patterning.

When the spin coating method is used as illustrated in FIG. 12A, the raised portion 41 of the piezoelectric body 4 has a curved shape and thus, the raised portion 51 of the upper electrode 5 has a curved shape. When patterning is used as illustrated in FIG. 12B, the raised portion 41 of the piezoelectric body 4 has a linear shape and thus, the raised portion 51 of the upper electrode 5 has a linear shape.

When patterning is performed to form the raised portion 41 of the piezoelectric body 4, the height of the raised portion 41 of the piezoelectric body 4 is determined by the amount of etching. Therefore, it is possible to set the height of the raised portion 41 of the piezoelectric body 4 to any desired value by adjusting the amount of etching.

The height of the raised portion 41 of the piezoelectric body 4 can be appropriately selected. Assuming that the surface of the piezoelectric body 4, except for the raised portion 41, is considered a base, the height here refers to a height from the base. For example, the height of the raised portion 41 of the piezoelectric body 4 is made larger than the height of the thick portion 31 of the lower electrode 3 (height from the thin portion 32). In this case, the strength of the electric field to be applied to the piezoelectric body 4 can be reduced. Thus, concentration of stress on the piezoelectric body 4 can be reduced. Therefore, formation of the thick portion 31 of the lower electrode 3 makes it possible to obtain a more effective configuration together with the effect of preventing damage to the piezoelectric body 4. This corresponds to satisfying the above-described relationship: t3–t4<t2–t1.

However, if the height of the raised portion 41 of the piezoelectric body 4 is too large, the piezoelectric body 4 may be damaged due to a difference in stress between the raised portion 41 and the rest of the piezoelectric body 4. When patterning is used in consideration of these points, the height (thickness) of the raised portion 41 of the piezoelectric body 4 is preferably larger than the height (thickness) of the thick portion 31 of the lower electrode 3 and twice or less the height (thickness) of the thick portion 31 of the lower electrode 3.

Meanwhile, in the spin coating method, the thickness of the raised portion 41 of the piezoelectric body 4 is less likely to be equal to or larger than the thickness of the thick portion 31 of the lower electrode 3. Therefore, when the spin coating method is used, the height (thickness) of the raised portion 41 of the piezoelectric body 4 is preferably 0.4 times or more and 0.8 times or less the height (thickness) of the thick portion 31 of the lower electrode 3.

The width of the raised portion 41 of the piezoelectric body 4 can be appropriately selected. In order to maintain a sufficient interelectrode distance (distance between the lower electrode 3 and the upper electrode 5) in the region where the thick portion 31 of the lower electrode 3 has been formed, it is desirable that the width of the raised portion 41 of the piezoelectric body 4 be slightly larger than the width of the thick portion 31 of the lower electrode 3. In the examples illustrated in FIGS. 12A and 12B, the width of the raised portion 41 of the piezoelectric body 4 is slightly larger than the width of the thick portion 31 of the lower electrode 3.

The width of the raised portion 41 of the piezoelectric body 4 is preferably set as follows, for example. The distance from a center point in the width direction of the raised portion 41 to the end of the piezoelectric body 4 is preferably larger than one times the distance from a center point in the width direction of the thick portion 31 to the end of the lower electrode 3.

Next, a lead wire is formed. Illustration of the lead wire is omitted. As the lead wire, TiN and Al are deposited by, for example, the sputtering method to a film thicknesses of, for example, 30 nm and 3 μm, respectively.

TiN and Al also function as barrier layers that prevent Pt, which is a material of the electrode, from being alloyed as a result of a thermal history in a subsequent step. When Pt is used as the material of the lower electrode 3 or the material of the upper electrode 5, Pt may be alloyed as a result of the thermal history in the subsequent step, and film peeling or the like may occur due to stress resulting from a volume change. Al in the lead wire is in contact with Pt, which is an electrode material, not only at a portion where the lead wire is connected to the common electrode, but also at a portion where the lead wire is connected to the individual electrode. Thus, the lead wire serves as a barrier layer.

The material of the lead wire is not limited to the above materials. Other material can be appropriately selected. A material having low resistance just needs to be used for the lead wire. Thus, a material containing Au, Ni, Cr, or the like may be used.

Next, in order to form the liquid chamber 7, the liquid chamber substrate 1 is polished by a known technique so as to achieve a desired thickness (for example, a thickness of 800 μm). The liquid chamber substrate 1 may be etched, instead of being polished.

Next, the liquid chamber substrate 1 is covered with resist by a lithography method. Thereafter, anisotropic wet etching is performed with an alkaline solution (KOH solution or tetramethylammonium hydroxide (TMAH) solution) to form the liquid chamber 7. A method other than anisotropic etching using an alkaline solution may be used to form the liquid chamber 7. For example, dry etching using an inductively coupled plasma (ICP) etcher may be used to form the liquid chamber 7.

Next, the nozzle plate 300 in which the nozzle 8 has been provided at a position corresponding to each liquid chamber 7 is joined to the liquid chamber substrate 1. The nozzle plate 300 is separately formed, for example. As a result, a liquid discharge head using the piezoelectric actuator of the present embodiment is produced.

Fifth Embodiment (Description of Low Dielectric Layer)

Next, an embodiment using a low dielectric layer will be described.

Seventh and Eighth Examples

In a seventh example of the present embodiment, a low dielectric layer is formed between the lower electrode 3 and the piezoelectric body 4 in the second region (2), and the dielectric constant of the low dielectric layer is lower than the dielectric constant of the piezoelectric body 4.

In an eighth example in the present embodiment, a low dielectric layer is formed between the upper electrode 5 and the piezoelectric body 4 in the second region (2), and the dielectric constant of the low dielectric layer is lower than the dielectric constant of the piezoelectric body 4.

Figure 13A:
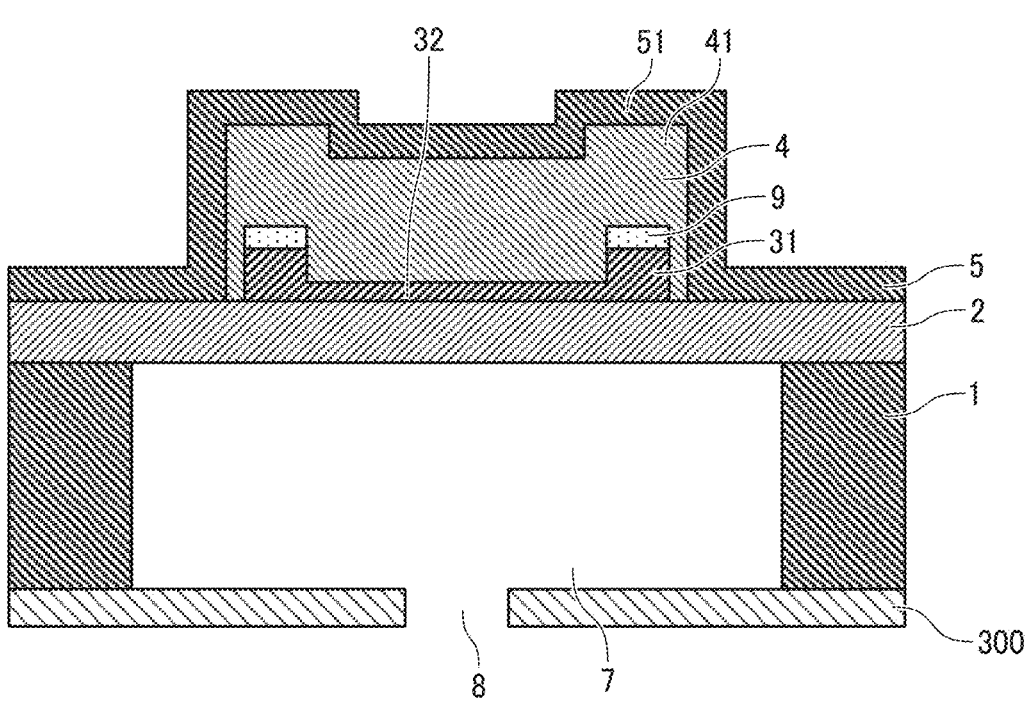
FIGS. 13A and 13B are cross-sectional schematic diagrams for describing seventh and eighth example.
Figure 13B:
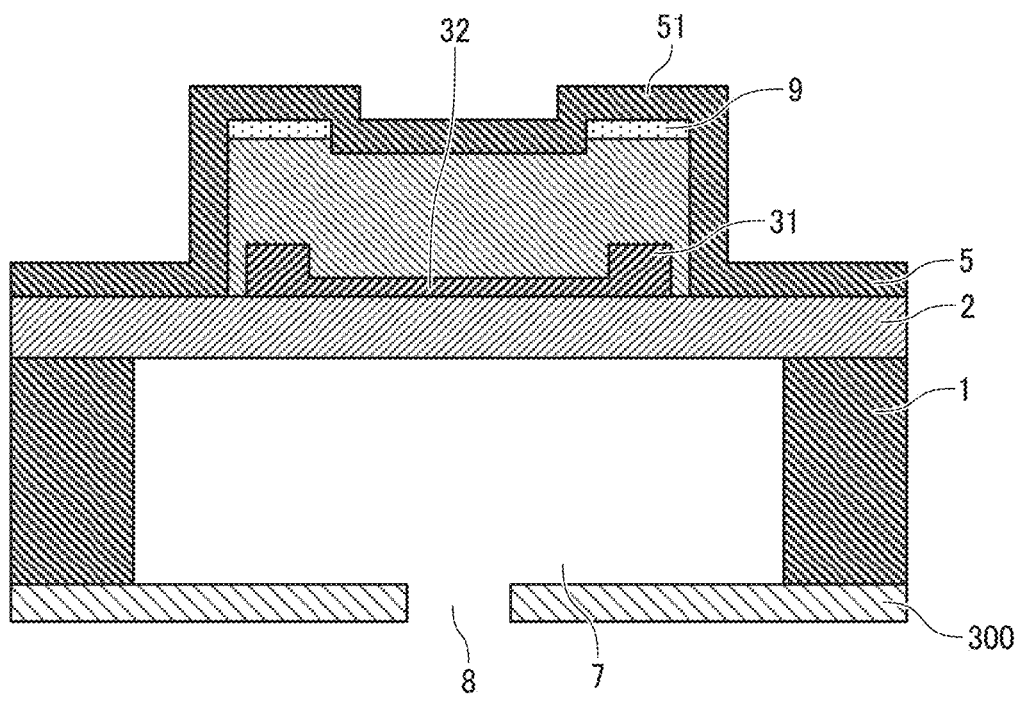

FIGS. 13A and 13B are cross-sectional schematic diagrams for describing the examples of the present embodiment. FIG. 13A is a diagram illustrating the seventh example, in which a low dielectric layer 9 has been formed between the upper portion of the thick portion 31 of the lower electrode 3 and the piezoelectric body 4. FIG. 13B is a diagram illustrating the eighth example, in which the low dielectric layer 9 has been formed between the lower portion of the raised portion 51 of the upper electrode 5 and the piezoelectric body 4. In other words, the low dielectric layer 9 has been formed on the raised portion 41 of the piezoelectric body 4 and below the upper electrode 5.

The piezoelectric actuator includes a low dielectric layer between the lower electrode and the piezoelectric body in the first direction in the second region, and the low dielectric layer has a dielectric constant lower than the piezoelectric body.

The piezoelectric actuator includes a low dielectric layer between the upper electrode and the piezoelectric body in the first direction in the second region, and the low dielectric layer has a dielectric constant lower than the piezoelectric body.

The low dielectric layer 9 has a dielectric constant lower than the dielectric constant of the piezoelectric body 4. It is possible to reduce an electric field to be applied to the piezoelectric body 4 and to reduce the amount of displacement by forming the low dielectric layer 9. Therefore, cracks in the piezoelectric body 4 can be prevented, and the durability of the piezoelectric element and the piezoelectric actuator can be improved.

In addition, the low dielectric layer 9 formed on the thick portion 31 as in the seventh example enables the thick portion 31 to exert an improved effect of preventing stress concentration. In addition, the low dielectric layer 9 formed on the raised portion 41 of the piezoelectric body 4 as in the eighth example increases interelectrode distance. As a result, dielectric breakdown is easily prevented.

The low dielectric layer 9 may be formed in both the portion illustrated in FIG. 13A and the portion illustrated in FIG. 13B.

The material of the low dielectric layer 9 can be appropriately selected as long as the low dielectric layer 9 has a dielectric constant lower than the dielectric constant of the piezoelectric body 4. Examples the material of the low dielectric layer 9 include $TiO_2$, $ZrO_2$, $PbTiO_3$, $PbZrO_3$, $SiO_2$, and $BaTiO_3$.

The material of the low dielectric layer 9 may be the same as the material of the piezoelectric body 4. In this case, a production method is changed so as to make the dielectric constant of the low dielectric layer 9 lower than the dielectric constant of the piezoelectric body 4. For example, in a case where lead zirconate titanate (PZT) which is a composite oxide of $PbTiO_3$ and $PbZrO_3$ is used as the material of the low dielectric layer 9 and the piezoelectric body 4, a method is used in which the ratio of Ti to Zr or firing temperature is changed so as to reduce the crystallinity of the low dielectric layer 9.

In a case where the low dielectric layer 9 is formed on the thick portion 31 (in the case of the seventh example), the low dielectric layer 9 is formed before the piezoelectric body 4 is formed. Therefore, it is possible to prevent the piezoelectric body 4 from suffering etching damage or the like due to formation of the low dielectric layer 9. However, there may be a difference in crystallinity between the piezoelectric body 4 on the low dielectric layer 9 and the piezoelectric body 4 on the lower electrode 3. Therefore, a difference in the crystallinity of the piezoelectric body 4 due to a difference in a base is considered in the fourth example.

In a case where the low dielectric layer 9 is formed on the raised portion 41 of the piezoelectric body 4 (in the case of the eighth example), it is not necessary to consider a difference in the crystallinity of the piezoelectric body 4 due to a difference in the base. Meanwhile, since the low dielectric layer 9 is formed after the piezoelectric body 4 is formed, attention should be paid to the fact that formation of the low dielectric layer 9 causes etching damage or the like to the piezoelectric body 4.

Ninth and Tenth Examples

Figures 1, 14A:
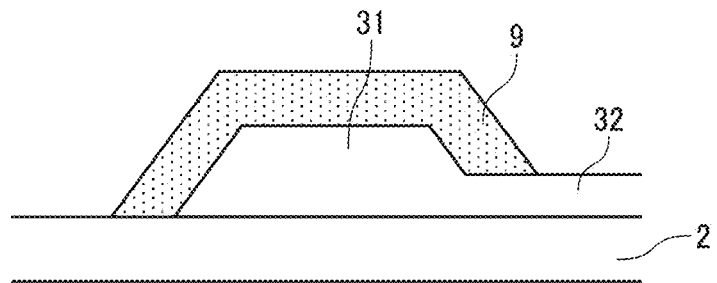
FIG. 14A-1 is a cross-sectional schematic diagram for describing a ninth example.
Figures 2, 14A:
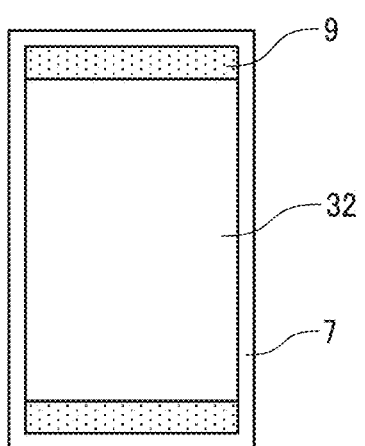
Figures 1, 14B:
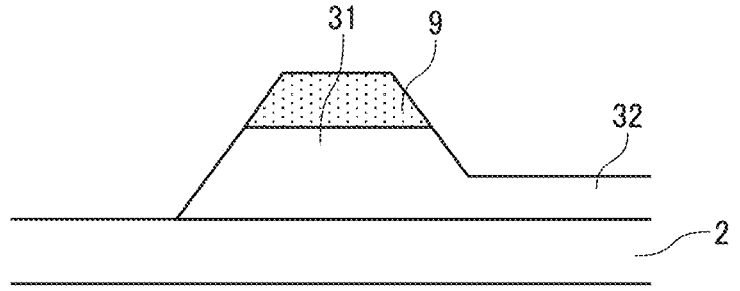
Figures 2, 14B:
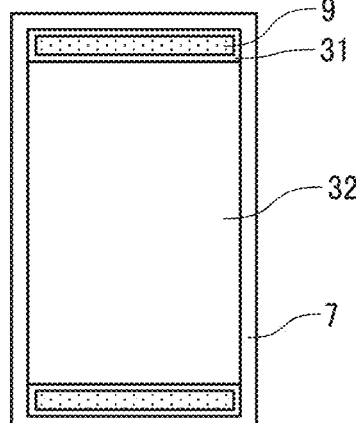

FIGS. 14A-1 and 14A-2 are diagrams for describing a ninth example. FIGS. 14B-1 and 14B-2 are diagrams for describing a tenth example. The ninth and tenth examples are modifications of the seventh example. FIGS. 14A-1 is a schematic cross-sectional view of the ninth example. FIGS. 14A-2 is a schematic plan view of a main part of the ninth example as viewed from above. FIGS. 14B-1 is a schematic cross-sectional view of the tenth example. FIGS. 14B-2 is a schematic plan view of a main part of the tenth example as viewed from above.

As illustrated in the ninth and tenth examples, the shape of the low dielectric layer 9 can be appropriately selected in the seventh example. As in the ninth example, the low dielectric layer 9 may cover side faces of the thick portion

31. In this case, since the low dielectric layer 9 firmly adheres to the side faces and upper face of the thick portion 31, the area of contact between the low dielectric layer 9 and the thick portion 31 can be increased. Therefore, adhesion between the low dielectric layer 9 and the thick portion 31 is improved. It is thus possible to prevent the low dielectric layer 9 from being peeled due to stress.

As in the tenth example, the low dielectric layer 9 need not cover the side faces of the thick portion 31. In this case, the low dielectric layer 9 and the thick portion 31 can be processed by use of the same photomask when processed by photolithography. Therefore, the low dielectric layer 9 and the thick portion 31 can be formed with a small number of processing steps.

Sixth Embodiment (Description of Apparatus for Discharging Liquid)

An apparatus for discharging liquid according to the present disclosure will be described. Examples of the apparatus for discharging liquid according to the present disclosure include an image forming apparatus, a printing apparatus, a recording apparatus, an inkjet recording apparatus, and an inkjet printer. The apparatus for discharging liquid may be referred to as a liquid discharge apparatus or the like.

Figure 15:
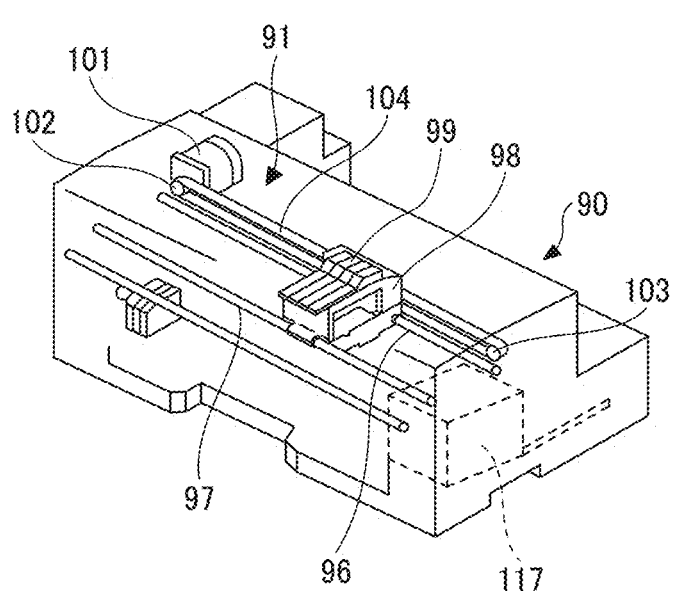
FIG. 15 is a perspective schematic diagram illustrating an example of a liquid discharge apparatus according to the present disclosure.
Figure 16:
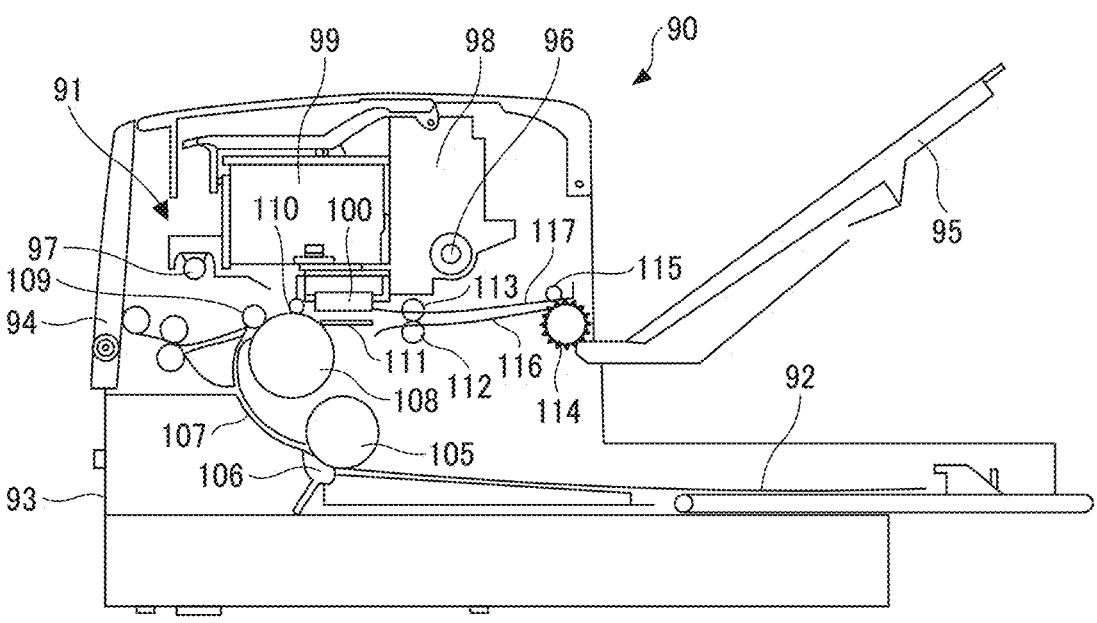
FIG. 16 is a side schematic diagram illustrating the example of the liquid discharge apparatus according to the present disclosure.

FIGS. 15 and 16 illustrate an example of the liquid discharge apparatus according to the present disclosure. FIG. 15 is a schematic perspective view of an inkjet recording apparatus 90 that is an example of the liquid discharge apparatus. FIG. 16 is a schematic side view of the same apparatus. FIG. 16 may be referred to as a schematic cross-sectional view of the same apparatus.

The inkjet recording apparatus 90 includes, for example, a carriage 98, a liquid discharge head 10, and ink cartridges 99. The liquid discharge head 10 is mounted on the carriage 98. The carriage 98 is movable in a main scanning direction in an apparatus body. The ink cartridges 99 supply ink to the liquid discharge head 10. A section including the carriage 98, the ink cartridges 99, and the like is referred to as a printing mechanism unit 91.

A sheet feeding cassette 93 is detachably attached to a lower portion of the apparatus body. A large number of sheets 92 can be loaded onto the sheet feeding cassette 93 from the front side. The sheet feeding cassette 93 may be a sheet feeding tray. In addition, the inkjet recording apparatus 90 may include a bypass feeder 94 openable so as to manually feed the sheets 92.

The inkjet recording apparatus 90 takes in the sheet 92 fed from the sheet feeding cassette 93 or the bypass feeder 94, and causes the printing mechanism unit 91 to record a necessary image on the sheet 92. Thereafter, the sheet 92 on which the image has been recorded is ejected to a sheet ejection tray 95. The sheet ejection tray 95 is mounted on, for example, the rear surface side of the apparatus.

The printing mechanism unit 91 includes a main guide rod 96 and a sub-guide rod 97. The main guide rod 96 and the sub-guide rod 97 are guide members laterally bridged on left and right side plates. The printing mechanism unit 91 holds the main guide rod 96 and the sub-guide rod 97 such that the carriage 98 can slidably move in the main scanning direction.

The liquid discharge head 10 discharges ink droplets of colors of yellow (Y), cyan (C), magenta (M), and black (Bk), for example. Liquid to be discharged by the liquid discharge head 10 is not limited thereto, and can be appropriately changed. Furthermore, ink of each color may be discharged by corresponding one of liquid discharge heads.

The liquid discharge head 10 includes a plurality of nozzles. The liquid discharge head 10 is mounted on the carriage 98 such that, for example, the nozzles are arranged in a direction intersecting the main scanning direction. The liquid discharge head 10 is mounted on the carriage 98 such that liquid is discharged downward.

The ink cartridges 99 for supplying ink of different colors to the liquid discharge head 10 are mounted on the carriage 98. Each ink cartridge 99 is replaceable. An atmosphere port is provided at an upper portion of each ink cartridge 99, and a supply port is provided at a lower portion of each ink cartridge 99. The atmosphere port communicates with the atmosphere. Ink is supplied from the supply port to the liquid discharge head 10. A porous body filled with ink is provided inside the supply port. Ink to be supplied to the liquid discharge head 10 is maintained at a slightly negative pressure by the capillary force of the porous body in each ink cartridge 99.

The carriage 98 is slidably fitted on the main guide rod 96 on the rear side (downstream side in a sheet conveyance direction), and is slidably placed on the sub-guide rod 97 on the front side (upstream side in the sheet conveyance direction). In order to enable the carriage 98 to move and perform scanning in the main scanning direction, a timing belt 104 is stretched around a driving pulley 102 and a driven pulley 103. The carriage 98 is secured to the timing belt 104. The driving pulley 102 and the driven pulley 103 are rotationally driven by a main scanning motor 101. Forward and reverse rotation of the main scanning motor 101 drives and causes the carriage 98 to reciprocate.

The inkjet recording apparatus 90 includes a sheet feeding roller 105, a friction pad 106, a guide member 107, a conveyance roller 108, a conveyance roller 109, and a leading end roller 110. The inkjet recording apparatus 90 uses these rollers to convey the sheet 92 set in the sheet feeding cassette 93 to a position below the liquid discharge head 10.

The sheet feeding roller 105 and the friction pad 106 separate the sheet 92 from the other sheets 92 in the sheet feeding cassette 93, and feed the sheet 92. The guide member 107 guides the sheet 92. The conveyance roller 108 reverses and conveys the fed sheet 92. In addition, the conveyance roller 108 is driven to rotate via a gear train by a sub-scanning motor. The conveyance roller 109 is pressed against the peripheral surface of the conveyance roller 108. The leading end roller 110 defines an angle at which the sheet 92 is fed from the conveyance roller 108.

The inkjet recording apparatus 90 includes a print receiving member 111 which is a sheet guide member. The print receiving member 111 guides, on the lower side of the liquid discharge head 10, the sheet 92 fed from the conveyance roller 108 in accordance with the range of movement of the carriage 98 in the main scanning direction.

A conveyance roller 112 and a spur 113 are provided on a downstream side of the print receiving member 111 in the sheet conveyance direction. The conveyance roller 112 and the spur 113 perform rotational driving for feeding the sheet 92 in a sheet ejecting direction.

The inkjet recording apparatus 90 includes a sheet ejection roller 114, a spur 115, and guide members 116 and 117. The sheet ejection roller 114 and the spur 115 send the sheet 92 to the sheet ejection tray 95. The guide members 116 and 117 form a sheet ejection path.

At the time of recording, the inkjet recording apparatus 90 drives the liquid discharge head 10 according to an image signal while moving the carriage 98. Thus, the inkjet recording apparatus 90 discharges ink onto the sheet 92 not in motion to record one row, and then conveys the sheet 92 by a predetermined amount to perform recording of a next row. When the inkjet recording apparatus 90 receives a signal indicating an end of recording operation or a signal indicating that a rear end of the sheet 92 has reached a recording area, the inkjet recording apparatus 90 terminates the recording operation, and ejects the sheet 92.

The inkjet recording apparatus 90 includes, for example, a recovery device 118 at the right end in the direction of movement of the carriage 98. The recovery device 118 is located outside the recording area. The recovery device 118 causes the liquid discharge head 10 to recover from discharge failure. The recovery device 118 includes, for example, a capping unit, a suction unit, and a cleaning unit. A description will be given of an example of recovery operation to be performed by the recovery device 118.

In a printing standby state, the inkjet recording apparatus 90 moves the carriage 98 to the recovery device 118, and causes the liquid discharge head 10 to be capped with the capping unit. Thus, the nozzles of the liquid discharge head 10 can be kept wet, and discharge failure due to drying of ink can be prevented.

During recording or the like, the inkjet recording apparatus 90 can also discharge ink not relevant to recording by using the recovery device 118. Thus, ink viscosity can be made uniform between the nozzles, and a stable discharge state can be maintained.

When a discharge failure occurs, the inkjet recording apparatus 90 may perform operation of sealing a discharge surface (may be referred to as a nozzle forming surface or the like) of the liquid discharge head 10 by means of the capping unit. The discharge surface is capped by the capping unit, and ink, bubbles in the ink, and the like are sucked from the nozzles by the suction unit through, for example, a tube. Thus, the liquid discharge head 10 can recover from the discharge failure. The sucked ink is discharged to, for example, a waste ink reservoir installed in a lower portion of the apparatus body, and is absorbed and held by an ink absorber located inside the waste ink reservoir.

Ink, dust, and the like adhering to the nozzle forming surface of the liquid discharge head 10 may be removed by the cleaning unit. Thus, the liquid discharge head 10 can recover from the discharge failure.

Since the inkjet recording apparatus 90 is equipped with the liquid discharge head 10 of the present disclosure, it is possible to achieve good durability and reliability, and stable discharge characteristics. Thus, image quality is improved.

The case where the liquid discharge head 10 discharges ink has been mainly described above as an example. However, liquid to be discharged by the liquid discharge head 10 is not limited to ink. Examples of the liquid other than ink include a liquid resist for patterning. According to the present disclosure, it is possible to provide a piezoelectric actuator that can prevent breakage of a piezoelectric body.

Aspects of the present disclosure are, for example, as follows.

Aspect 1

According to Aspect 1, a piezoelectric actuator includes:

a substrate having an opening;

a diaphragm on one face of the substrate, the diaphragm being formed in a region including the opening;

a lower electrode on a surface of the diaphragm opposite to the substrate, the lower electrode being formed in at least a part of a region on an inner side of the opening as viewed from a first direction, the first direction being defined as a direction orthogonal to the one face;

a piezoelectric body on the lower electrode; and an upper electrode on the piezoelectric body, wherein in a case where an active region is defined as a region where the opening, the diaphragm, the lower electrode, the piezoelectric body, and the upper electrode all overlap as viewed from the first direction, the lower electrode has a first region and a second region, the first region being in the active region, the lower electrode having a thickness of a first thickness t1 in the first region, the second region being provided in such a way as to be at least partially included in the active region as viewed from the first direction, the lower electrode having a thickness of a second thickness t2 in the second region, the second thickness t2 being larger than the first thickness t1, and in a case where a distance t3 is defined as a distance in the first direction from the diaphragm to the upper electrode in the second region, the first region includes a region where a distance in the first direction from the diaphragm to the upper electrode is a distance t4 smaller than the distance t3.

Aspect 2

According to Aspect 2, in the piezoelectric actuator of Aspect 1, the distance t3 in the first direction from the diaphragm to the upper electrode in the second region is larger than a distance in the first direction from the diaphragm to the upper electrode in a rest of the active region.

Aspect 3

According to Aspect 3, in the piezoelectric actuator of Aspect 1 or 2, the upper electrode and the piezoelectric body are provided in such a way as to cover the first region and the second region in the active region as viewed in a cross section along the first direction.

Aspect 4

According to Aspect 4, in the piezoelectric actuator of Aspect 3, the piezoelectric body has a side face portion in a region on the inner side of the opening, the region being located outside a region including the first region and the second region as viewed in the cross section along the first direction, and the side face portion of the piezoelectric body is covered with the upper electrode.

Aspect 5

According to Aspect 5, in the piezoelectric actuator of any one of Aspects 1 to 4, the piezoelectric body is provided in such a way as to overlap the first region and a part of the second region in the first direction as viewed in a cross section along the first direction, and the upper electrode is formed such that the piezoelectric body formed in the part of the second region and an end of the upper electrode overlap each other in the first direction, the upper electrode being formed such that a portion formed in the first region and a portion formed in the second region are coupled to each other.

Aspect 6

According to Aspect 6, in the piezoelectric actuator of Aspect 5, a side face portion of the piezoelectric body is formed in the second region as viewed in the cross section along the first direction, and the upper electrode is not formed on the side face portion.

Aspect 7

According to Aspect 7, in the piezoelectric actuator of any one of Aspects 1 to 6, at an end of the opening, the lower electrode, the piezoelectric body, and the upper electrode are at least partially formed from an inner side toward an outer side of the opening as viewed from the first direction, and at least a part of the end of the opening is in the second region.

Aspect 8

According to Aspect 8, in the piezoelectric actuator of any one of Aspects 1 to 7, a low dielectric layer is formed between the lower electrode and the piezoelectric body in the second region, and a dielectric constant of the low dielectric layer is lower than a dielectric constant of the piezoelectric body.

Aspect 9

According to Aspect 9, in the piezoelectric actuator of any one of Aspects 1 to 8, a low dielectric layer is formed between the upper electrode and the piezoelectric body in the second region, and a dielectric constant of the low dielectric layer is lower than a dielectric constant of the piezoelectric body.

Aspect 10

According to Aspect 10, in the piezoelectric actuator of any one of Aspects 1 to 9, a difference (t3−t4) between the distance t3 and the distance t4 is smaller than a difference (t2−t1) between the second thickness t2 and the first thickness t1 such that t3−t4<t2−t1.

Aspect 11

According to Aspect 11, a liquid discharge head includes:

the piezoelectric actuator of any one of Aspects 1 to 10; and a nozzle forming member joined to the substrate, the nozzle forming member and the diaphragm being located on opposite sides of the substrate, a nozzle corresponding to the opening being formed in the nozzle forming member, wherein liquid stored in the opening is discharged from the nozzle.

Aspect 12

According to Aspect 12, a liquid discharge apparatus includes: the liquid discharge head of Aspect 11; and a driver that drives the piezoelectric actuator.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A piezoelectric actuator comprising:

a substrate having an opening;

a diaphragm having one face on the substrate in a first direction, the diaphragm facing the opening;

a lower electrode on another face of the diaphragm opposite to the one face of the diaphragm in the first direction;

a piezoelectric body on the lower electrode in the first direction; and an upper electrode on the piezoelectric body in the first direction, wherein the lower electrode has a thick portion on a part of the lower electrode, the thick portion has a thickness larger than a portion other than the part of the lower electrode in the first direction, the upper electrode has a raised portion on a part of the upper electrode covering at least a portion of the thick portion of the lower electrode in a second direction orthogonal to the first direction, and the raised portion is raised above a rest of the upper electrode in the first direction.

2. The piezoelectric actuator according to claim 1, further comprising:

an active region having the opening, the diaphragm, the lower electrode, the piezoelectric body, and the upper electrode overlapping in the first direction, wherein the part of the lower electrode has the thick portion and the part of the upper electrode has the raised portion in a vicinity of an end of the active region in the second direction.

3. The piezoelectric actuator according to claim 2, the lower electrode has:

a first region having a first thickness t1 in the first direction in the active region; and a second region, in which the thick portion is formed, having a second thickness t2 larger than the first thickness t1 in the first direction, and the piezoelectric actuator having:

a distance t3 from the diaphragm to the upper electrode in the first direction in the second region; and a distance t4 from the diaphragm to the upper electrode in the first region in the first direction, the distance t4 smaller than the distance t3 in the first direction.

4. The piezoelectric actuator according to claim 3, wherein the distance t3 is larger than a distance from the diaphragm to the upper electrode in the first direction in the first region.

5. The piezoelectric actuator according to claim 3, wherein the upper electrode and the piezoelectric body cover the first region and the second region in the active region in the second direction.

6. The piezoelectric actuator according to claim 3, wherein the piezoelectric body has a side face disposed:

inside the opening in the second direction; and outside the first region and the second region in the second direction, and the upper electrode covers the side face of the piezoelectric body.

7. The piezoelectric actuator according to claim 3, wherein the piezoelectric body covers the first region and a part of the second region in the second direction, and the upper electrode has an end covering a part of the piezoelectric body in the second region in the second direction, a portion of the upper electrode in the first region is coupled to a portion of the upper electrode in the second region.

8. The piezoelectric actuator according to claim 7, wherein the piezoelectric body has a side face in the second region, and the upper electrode does not cover the side face.

9. The piezoelectric actuator according to claim 3, wherein each of the lower electrode, the piezoelectric body, and the upper electrode is disposed across an end of the opening in the substrate in the second direction, and at least a part of the end of the opening is in the second region.

10. The piezoelectric actuator according to claim 3, further comprising a low dielectric layer between the lower electrode and the piezoelectric body in the first direction in the second region, and the low dielectric layer has a dielectric constant lower than the piezoelectric body.

11. The piezoelectric actuator according to claim 3, further comprising a low dielectric layer between the upper electrode and the piezoelectric body in the first direction in the second region, and the low dielectric layer has a dielectric constant lower than the piezoelectric body.

12. The piezoelectric actuator according to claim 3, wherein following expression is satisfied:

$$t3-t4<t2-t1,$$

where a difference (t3–t4) between the distance t3 and the distance t4 is smaller than a difference (t2–t1) between the second thickness t2 and the first thickness t1.

13. A liquid discharge head comprising:

the piezoelectric actuator according to claim 1; and a nozzle plate joined to the substrate, wherein the nozzle plate is on one face of the substrate, the diaphragm is on another face of the substrate opposite to the one face of the substrate, the nozzle plate having nozzle from which a liquid in the opening is dischargeable.

14. A liquid discharge apparatus comprising:

the liquid discharge head according to claim 13; and a driver to drive the piezoelectric actuator.

15. The piezoelectric actuator according to claim 1, further comprising an active region having the opening, the diaphragm, the lower electrode, the piezoelectric body, and the upper electrode overlapping in the first direction, wherein the lower electrode has:

a first region having a first thickness t1 in the first direction in the active region; and a second region having a second thickness t2 larger than the first thickness t1 in the first direction in the active region, and the piezoelectric actuator has:

a distance t3 from the diaphragm to the upper electrode in the first direction in the second region; and a distance t4 from the diaphragm to the upper electrode in the first region in the first direction, the distance t4 smaller than the distance t3 in the first direction.

*     *     *     *     *